(12) United States Patent
Jeong et al.

(10) Patent No.: US 7,929,359 B2
(45) Date of Patent: Apr. 19, 2011

(54) EMBEDDED DRAM WITH BIAS-INDEPENDENT CAPACITANCE

(75) Inventors: Jae Hong Jeong, Saratoga, CA (US); Jeong Y. Choi, Palo Alto, CA (US)

(73) Assignee: MoSys, Inc., Santa Clara, CA (US)

( * ) Notice: Subject to any disclaimer, the term of this patent is extended or adjusted under 35 U.S.C. 154(b) by 135 days.

(21) Appl. No.: 12/291,762

(22) Filed: Nov. 13, 2008

(65) Prior Publication Data
US 2010/0118596 A1      May 13, 2010

(51) Int. Cl.
G11C 5/14 (2006.01)
G11C 11/24 (2006.01)
G11C 8/00 (2006.01)

(52) U.S. Cl. ............... 365/189.09; 365/149; 365/230.06
(58) Field of Classification Search ............... 365/189.09
See application file for complete search history.

(56) References Cited

U.S. PATENT DOCUMENTS

| | | | |
|---|---|---|---|
| 5,600,598 A * | 2/1997 | Skjaveland et al. ...... 365/189.11 |
| 6,044,012 A * | 3/2000 | Rao et al. ...................... 365/182 |
| 6,075,720 A * | 6/2000 | Leung et al. .................. 365/149 |
| 6,147,914 A * | 11/2000 | Leung et al. ............. 365/189.09 |
| 6,468,855 B2 * | 10/2002 | Leung et al. .................. 438/239 |
| 6,493,282 B2 * | 12/2002 | Iida et al. ...................... 365/226 |
| 6,573,548 B2 * | 6/2003 | Leung et al. .................. 257/296 |
| 6,642,098 B2 * | 11/2003 | Leung et al. .................. 438/241 |
| 6,744,676 B2 * | 6/2004 | Leung et al. ............. 365/189.09 |
| 7,274,618 B2 * | 9/2007 | Leung ....................... 365/230.06 |
| 7,323,379 B2 * | 1/2008 | Sinitsky et al. ............... 438/210 |

* cited by examiner

*Primary Examiner* — Son L Mai
(74) *Attorney, Agent, or Firm* — Isabelle R. McAndrews

(57) ABSTRACT

An embedded memory system that includes DRAM cells and logic transistors. The capacitor of the embedded memory responds to a positive bias voltage of ½ Vdd. The wordline driver of a p-channel access transistor applying the positive power supply voltage when the p-channel access FET is not being accessed and a voltage lower than the threshold voltage of the p-channel access FET is being accessed. For DRAM cells containing an n-channel access FET, the wordline driver applies either a negative voltage or the ground voltage to the n-channel access FET when the DRAM cell is not being accessed. A second voltage composed of Vdd and a boosted voltage is applied to the n-channel FET when the DRAM cell is being accessed.

11 Claims, 19 Drawing Sheets

EMBEDDED DRAM WITH BIAS-INDEPENDENT CAPACITANCE

RELATED APPLICATIONS

The present application is related to U.S. Pat. Nos. 6,468,855; 6,573,548; 6,642,098; 6,654,295; 6,784,048; and 7,323,379. All of the aforementioned patents are commonly assigned to Mosys, Inc., the assignee of the present application. This application is also related to U.S. patent application entitled "Embedded DRAM with Multiple Gate Oxide Thicknesses" by Jeong Y. Choi Ser. No. 12/291,765, which is also assigned to Mosys, Inc. The disclosure of the aforementioned patent application is incorporated herein.

FIELD OF THE INVENTION

The present invention relates to Dynamic Random Access Memory (DRAM). More particularly, this invention relates to DRAM fabricated using a modified logic process. This invention further relates to the on-chip generation of precision voltages for the operation of DRAM embedded or fabricated using a modified logic process.

RELATED ART

Embedded semiconductors combine logic devices with memory circuits that require different voltage levels than the non-memory portions. The thickness of the gate oxide of the various devices on a chip is correlated to the performance of the integrated system. Typically, for high speed circuitry thin gate oxide layers are used. For example, logic devices typically have thinner gate oxides to enhance their speed performance. However, the desired gate oxide of the logic areas tends to be too thin for the capacitor of a DRAM on the same chip. Specifically, memory portions on a chip benefit from thicker gate oxide layers to avoid problems with gate tunneling effects. As detailed in U.S. Pat. No. 6,784,048, the gate tunneling current through the MOS capacitor becomes significant when using gate oxide thicknesses less than 30 Angstroms. Consequently, a thick gate dielectric oxide advantageously reduces the tunneling current through the capacitor of a DRAM. In sum, thicker gate oxides in the memory portion result in improved data retention. Complicating matters further is that generally all semiconductors, including embedded devices, are fabricated with I/O circuitry that has a different gate oxide thickness than either the logic or the memory areas of an integrated chip.

To enable the simultaneous operation of logic, memory and other integrated devices, numerous processes have been developed to produce different gate oxide thicknesses on the same chip. In the case of embedded DRAMs, a third oxidation step is introduced in the conventional dual gate oxide process. However, an additional thermal cycle tends to adversely affect the performance of high speed devices. Alternatively, it is known to implant nitrogen into semiconductor substrates to selectively retard the growth of oxide in certain portions of a wafer. However, nitrogen tends to deactivate certain dopants and degrade carrier mobility. It is also known to implant oxygen into different regions of a substrate to produce areas with different oxide thickness. However, an oxygen implant requires a relatively high-temperature activation that is detrimental to the logic devices. In summary, the aforementioned alternatives inevitably disturb the low voltage devices, such as the logic circuitry of the chip. Accordingly, a process is needed for fabricating embedded devices with multiple gate oxide thicknesses while preserving the characteristics of the LV (low voltage) devices contained on the same chip.

SUMMARY OF THE INVENTION

The present invention provides an embedded memory system that operates in response to a positive supply voltage. The memory system includes DRAM cells and logic transistors. The embedded DRAM has a capacitor that is biased with a positive voltage less than Vdd. The DRAM cell can be constructed with either PMOS or NMOS transistors.

In accordance with one embodiment of the invention, a DRAM storage structure includes a p-channel access FET in an n-well, a p-channel capacitor with a source/drain region connected to the second p-type source/drain region of the access transistor. A wordline driver connects to a gate terminal of the access transistor, and is configured to apply a positive power supply voltage to the gate terminal of the access transistor when the DRAM circuit is not being accessed. The wordline driver is further configured to apply a second voltage to the gate terminal of the access transistor when the DRAM circuit is being accessed, the second voltage being lower than the threshold voltage of the access transistor.

In another embodiment, a DRAM storage structure that includes an n-channel access FET in a p-well, an n-channel capacitor coupled to the second n-type source/drain region of the access transistor. A wordline driver connected to a gate terminal of the access transistor, the wordline driver being configured to apply a first voltage to the gate terminal of the access transistor when the DRAM circuit is not being accessed, the first voltage being between a negative voltage and the ground voltage. The wordline driver is further configured to apply a second voltage of Vdd and a boosted voltage to the gate terminal of the access FET when the DRAM circuit is being accessed.

FIG. 1A is a schematic diagram of a conventional DRAM cell 100 that is fabricated using a conventional logic process. FIG. 1B is a cross sectional view of DRAM cell 100. As used herein, a conventional logic process is defined as a single or twin well process with a single polycrystalline silicon layer and at least one metal layer.

The present invention is suitable for DRAMs integrated with high performance devices on the same chip. This invention can be implemented in either a planar DRAM cell or a quad-density DRAM cell (Q-cell for short). FIG. 2 is a cross-sectional view of a simple planar DRAM cell 200, which includes PMOS pass-gate select transistor 201 and storage capacitor 202. DRAM cell 200 is considered a planar cell because both select transistor 201 and storage capacitor 202 are located substantially at the surface of silicon substrate 220 (i.e., the surface of n-well region 221). Select transistor 201 includes drain 211, source 212, gate oxide 213 and gate electrode 214. Storage capacitor 202 is formed by a planar PMOS structure that includes source 212, capacitor dielectric layer 215 and counter-electrode 216. The charge stored by the planar storage capacitor 202 determines the logic state of the bit stored by DRAM cell 200. Field oxide 230 isolates DRAM cell 200 from other DRAM cells fabricated in N-well 221. DRAM cell 200 is described in more detail in U.S. Pat. No. 6,075,720 by Wingyu Leung and Fu-Chieh Hsu, entitled "Memory Cell For DRAM Embedded In Logic".

A Q-cell DRAM is described in U.S. Pat. Nos. 6,744,676, 6,642,098, and 7,323,379 all of which are assigned to Mosys, Inc. The capacitor structure of the Q-cell DRAM has a relatively large surface area because the capacitor structure is formed in a cavity in the dielectric region. This relatively large surface area results in a relatively large capacitance for the capacitor structure. However, the capacitor structure consumes a relatively small layout area because the capacitor structure is formed partially in a cavity.

DETAILED DESCRIPTION OF THE INVENTION

Figure 1A:
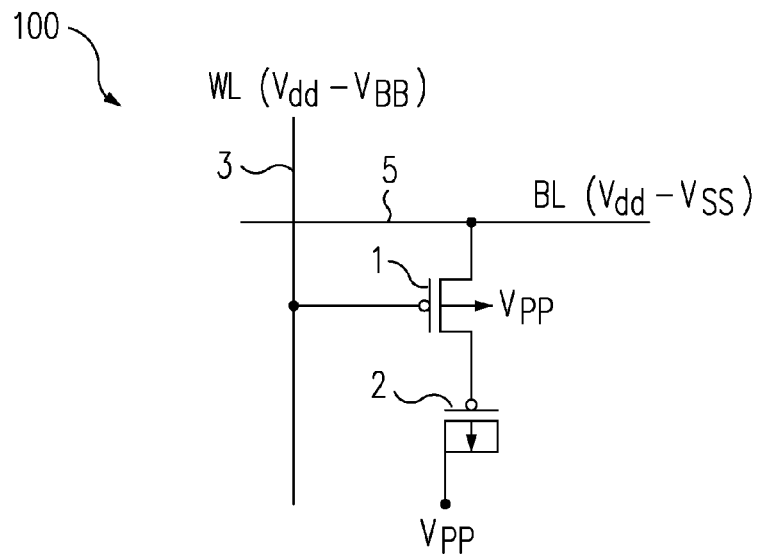
FIG. 1A is a schematic diagram of a DRAM cell formed by P-channel MOS transistors fabricated using a conventional logic process.
Figure 1B:
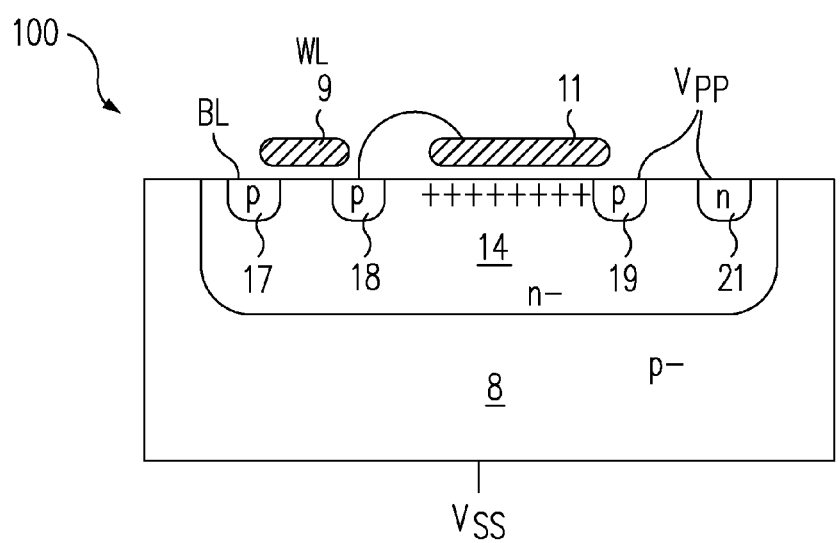
FIG. 1B is a cross sectional view of the DRAM cell of FIG. 1A.
Figure 2:
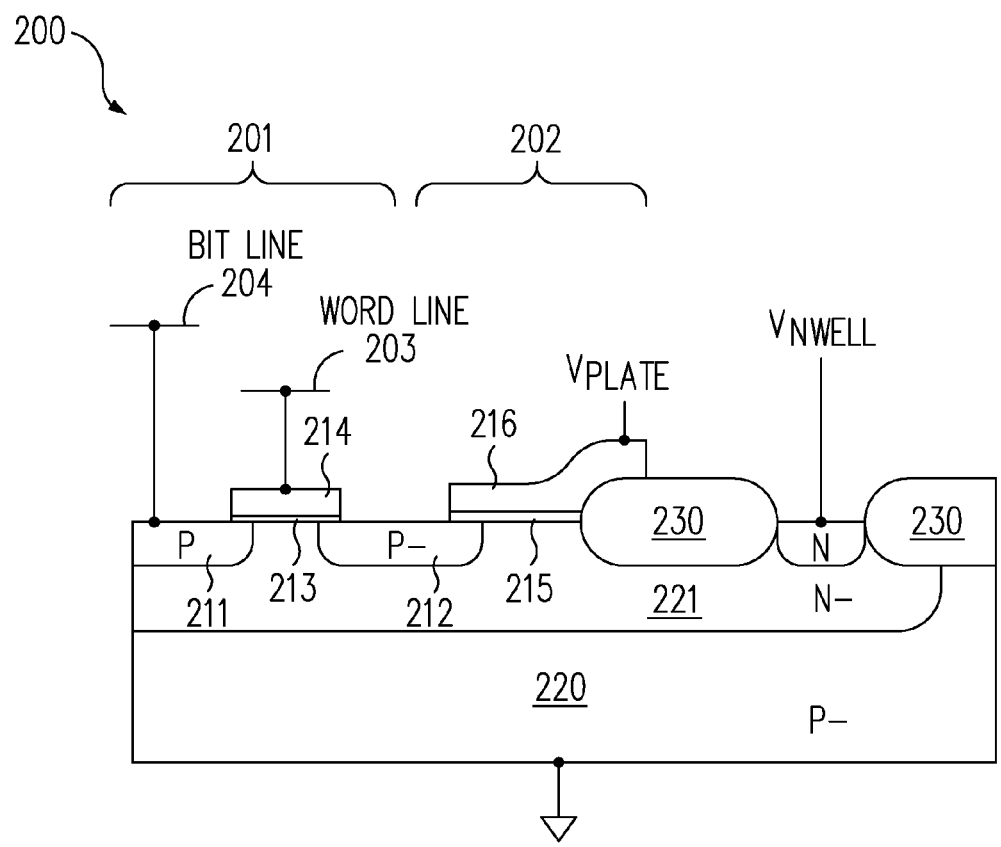
FIG. 2 is a cross sectional view of conventional planar DRAM cell, which includes a PMOS select transistor coupled to a planar storage capacitor.
Figure 3A:
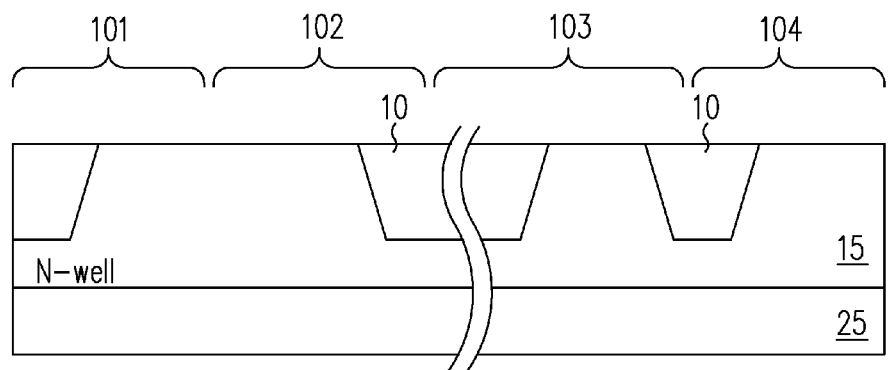
FIGS. 3A-3I are cross-sectional views of a process flow for manufacturing planar DRAM cells embedded in active logic circuitry in accordance with a first embodiment of the invention.

One embodiment of forming multiple gate oxides in an embedded DRAM is illustrated in FIGS. 3A-3I. This embodiment is directed toward planar DRAM cells embedded in a system. One such system can include areas 101-104 where an access transistor 101, capacitor 102, logic 103, and an I/O circuit 104 will be formed. In addition, FIG. 3A illustrates an n-well region 15 in a silicon substrate 25. In one embodiment, N-well 15 is formed by a conventional ion implantation process, and has a dopant concentration of approximately $1 \times 10^{17}$ $cm^3$. Of course, the conductivity types of the various regions can be reversed in other embodiments of the present invention. In particular, the DRAM cell array can be fabricated in a P-type triple-well and incorporate NMOS transistors. In such an embodiment, a deep N-type well and a triple P-type well are fabricated in place of N-well 15.

Figure 3B:
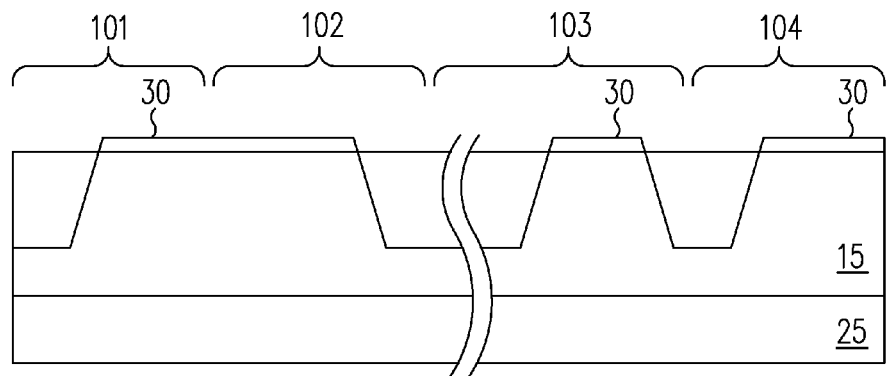

Certain active areas in FIG. 3A are separated by isolation regions 10 which in a preferred embodiment are shallow trenches formed by a conventional STI process. For example, multiple trenches are etched in silicon substrate 25, and subsequently these trenches are filled with silicon oxide or another dielectric material as shown in FIG. 3A. The upper surface of the resulting structure is then planarized by chemical-mechanical polishing (CMP), to render the material within the trench substantially coplanar with the upper surface of n-well 15. A sacrificial oxide layer 30 is then thermally grown over the planarized upper surface as also shown in FIG. 3B. Sacrificial layer 30 preferably has a thickness of less than 100 Å. In a more preferred embodiment, the thickness range for the sacrificial layer 30 is between 70-100 Angstroms. However, it is also acceptable for the sacrificial layer 30 to be as thin as 50 Angstroms.

In order to selectively implant into n-well 15, a photoresist mask 110 is positioned over substrate 15. Photoresist mask 110 covers a portion of sacrificial layer 30 to expose region 102. The first implant dopant is preferably of a conductivity type opposite that of the well 15. Accordingly, when a PMOS pass transistor and an n-well are used for the DRAM cell, the first implant—is preferably of p-type conductivity. With the photoresist mask 110 in place, the p-type dopant is implanted into silicon substrate 15 to form a shallow p-type region 18 below the sacrificial layer 30. Introducing the first implant dopant into the n-well of FIG. 3C accelerates oxide growth in the area 102.

The p-type dopant is implanted at a dosage level ranging from $1 \times 10^{14}$ $cm^{-2}$ to $2 \times 10^{15}$ $cm^{-2}$. More preferably, the dosage level for the p-type implant will range from $5 \times 10^{14}$ $cm^{-2}$ to $1 \times 10^{15}$ $cm^{-2}$. This implantation is preferably performed while oxide layer 30 is in place, and prior to the oxidation step of FIG. 3E. Although FIGS. 3A-3E demonstrate a specific process flow for forming a planar DRAM, various modifications can be made within the spirit of this invention. First, the oxidation enhancing implant may be performed prior to the thermal oxidation of FIG. 3B instead of prior to the oxidation step of FIG. 3E. Second, an n-type dopant may optionally be implanted at a dosage of $1 \times 10^{13}$ to $5 \times 10^{14}$ $cm^{-2}$ after the p-type implantation. Such a secondary implantation produces an n-type region 13 below the p-type region 18. An n-type implantation step will enhance the capacitor performance if the n-type dopant is provided at a more lightly doped dosage than the p-type dopant.

Figure 3C:
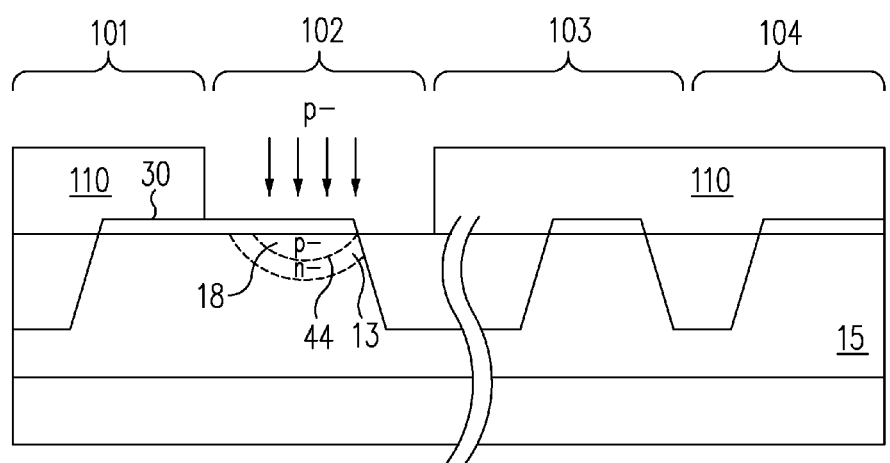

As a result of forming shallow p-type region 18, a p-n junction 44 is formed as shown in FIG. 3C. The p-n junction 44 serves as a source extension for the capacitor to thereby provide additional capacitance to the DRAM cell. The cell accordingly operates more stably due to the increased data retention of its capacitor. Consequently, the total capacitance of the DRAM cell is increased by the formation of p-n junction 44.

Figure 3D:
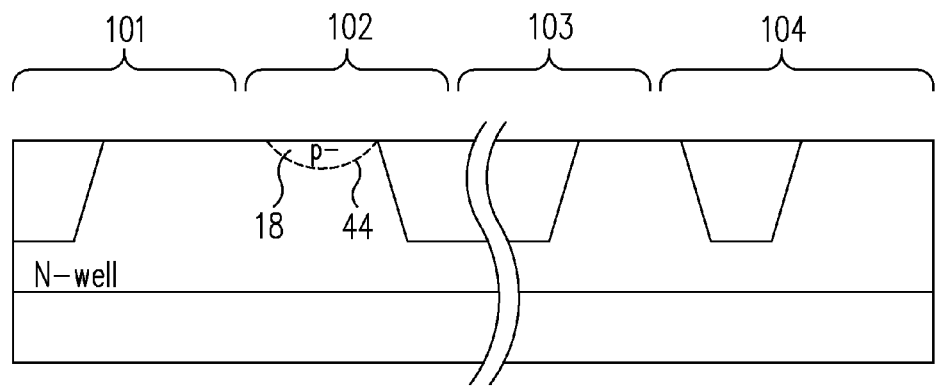
Figure 3E:
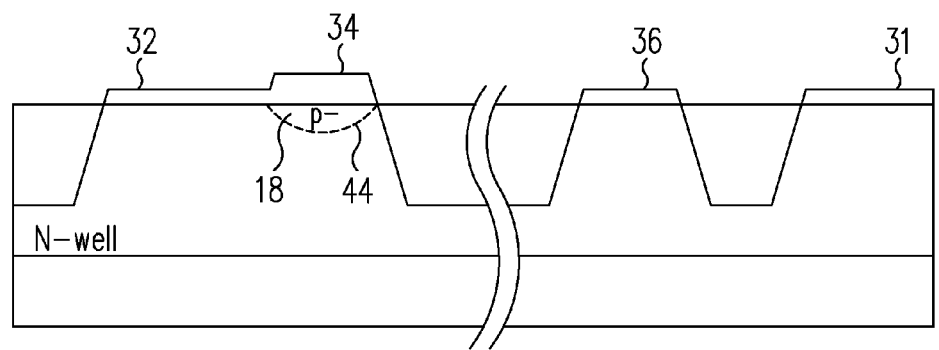

After the implantation shown in FIG. 3C, the photoresist mask 110 is stripped away. Next, the sacrificial oxide 30 is removed by etching to produce the structure of FIG. 3D. After removal of sacrificial oxide 30, the gate oxide 32 for the access transistor 101 and the capacitor oxide 34 are simultaneously grown via thermal oxidation without using any type of mask on the DRAM structure or additional oxidation step. FIG. 3E illustrates the oxide layer that is grown as including a first part 32, second part 34, third part 36, and a fourth part 31. Initially, parts 31, 32 and 36 have the same oxide thickness. As used herein, the terms "oxide layer" and "gate oxide" are not intended to be limited to solely oxide materials, as other types of dielectric material can be substituted for any gate oxide and any oxide layer. For example, suitable dielectrics for the gate dielectric may include silicon oxide, silicon nitride, silicon oxynitride, and high K dielectrics such as hafnium oxide. From henceforth, although the embodiments described herein refer to "oxide layer" or "gate oxide", it is understood that other suitable dielectrics may be used instead of oxide-containing material.

Figure 3F:
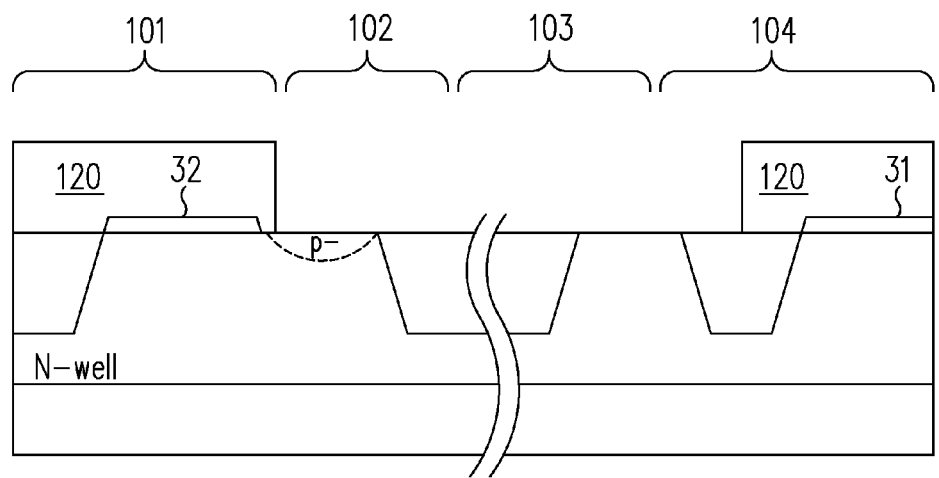
Figure 3G:
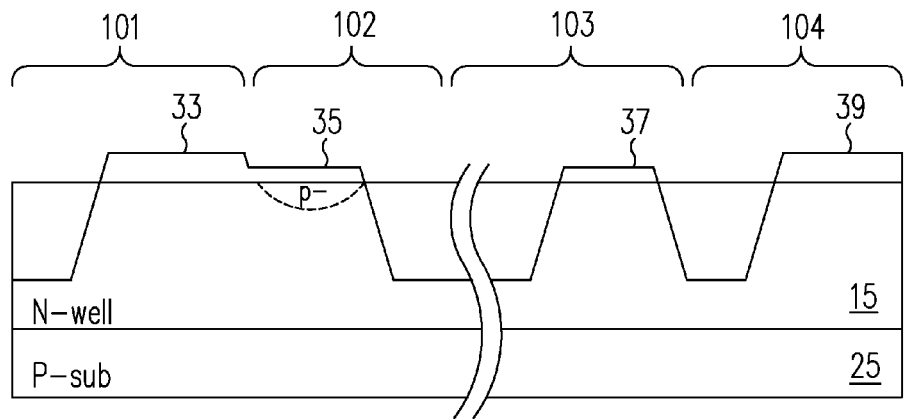

Turning to FIG. 3F, a photoresist mask 120 is provided over the access transistor region 101, and I/O region 104, and the resulting exposed oxide layers located in regions 102, and 103 are removed. Consequently, the gate oxide of the access transistor and of the I/O is grown in two separate oxidation steps, the first being shown in FIG. 3E. Then, photoresist mask 120 is stripped away, resulting in only the access transistor region 101 and I/O region 104 having an oxide layer. At this point a new oxide layer is thermally grown, which will increase the thickness of oxide portion 32 and oxide portion 31, and to thereby yield gate oxide regions 33 and 39 respectively. In addition, areas 102 and 103 will have a newly deposited oxide region on the top surface of substrate 25 to produce capacitor dielectric 35 and gate oxide 37 as shown in FIG. 3G. In the second oxidation step of FIG. 3G, the gate oxide 32 of access transistor is now shown as gate oxide 33 and the gate oxide of the I/O region is now 39. Specifically, gate oxide 33 of the access transistor is approximately 50 Angstroms or greater.

Both the first and second thermal oxidation steps are performed at a temperature range of 700-1100° C. More preferably, the oxidation steps are performed at a temperature range of 800-1000° C. Capacitor dielectric 35 is grown concurrently with the second oxidation step of the access transistor, but at a faster rate. Similarly, the capacitor dielectric 35 is grown at a faster rate than the gate oxide 37 of the logic area due to the presence of the first dopant implant. Thus, the dielectric 35 of the capacitor is grown to approximately 30-40 Å and the gate oxide 37 of the logic device is grown to approximately 15-28 Å. In this embodiment, regions 101 and 104 will have equivalent gate oxide thicknesses that range from 50 to more than 100 Angstroms. In a more preferred embodiment, the gate dielectric 35 of the capacitor has a thickness of approximately 32-38 angstroms and the gate oxide 37 of the logic device has a thickness of approximately 15-28 Å, whereas the gate oxides of the access transistor and of the I/O region preferably have a thickness between 50 and 70 Angstroms. Thus, in one embodiment the access transistor will have a thickness whose gate oxide is thicker than the gate oxide of the logic circuit. Similarly, the oxide portion 35 above doped region 18 will later form the dielectric of capacitor 102. Consequently, oxide portion 35 is also thicker than the oxide portion above the logic area 103. The difference in oxide thickness is due to the doped region 18 introduced in FIG. 3C. The above thickness ranges are provided merely for illustrative purposes. In general, the invention would not be suitable for wafers where the thinnest gate oxide is 35 angstroms or higher unless a special application requires the capacitor oxide to be above 40 Angstroms.

Figure 3H:
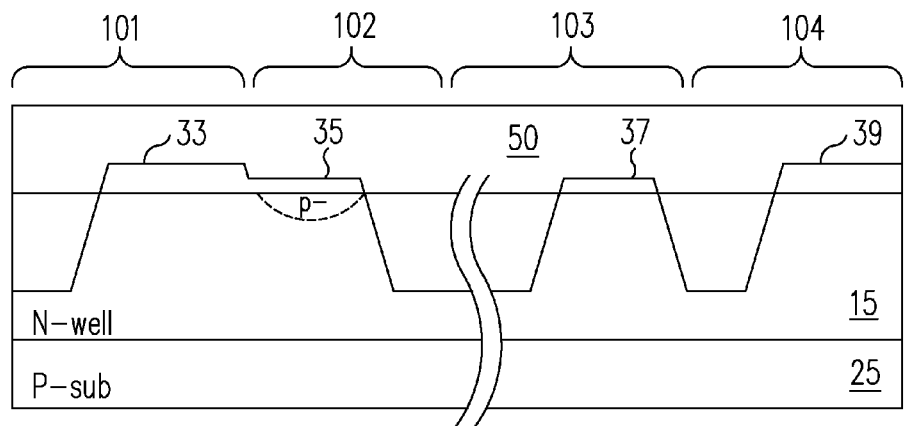

FIG. 3H illustrates the next step of the process where a polysilicon layer 50 is provided on the structure of FIG. 3G. Polysilicon layer 50 is selectively etched with a photoresist mask to form gate electrodes. The gate oxide of memory cell 102 will be thicker than the gate oxide of the logic portion 103. Thereafter spacers and source and drain regions are formed using conventional semiconductor processing to form the structure of FIG. 3I.

Figure 3I:
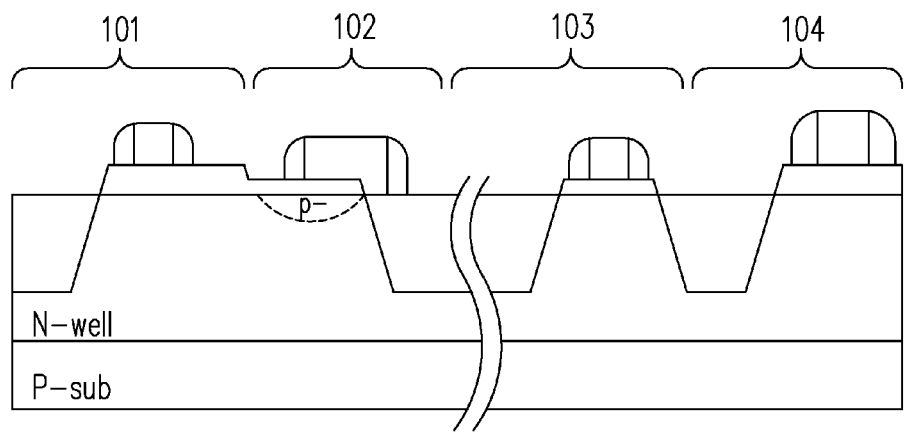

FIG. 3I illustrates a thick gate oxide for access transistor 101, a thin gate oxide for capacitor 102, a thinner gate oxide for logic area 103, and a thick gate oxide for I/O device 104. To attain the different thicknesses shown in FIG. 3I it is not necessary to subject the structure to an additional oxidation step to form gate oxide 102. In other words, the implantation step of FIG. 3C dispenses with the prior art step of providing an extra oxidation step to form the gate dielectric 35 of the capacitor.

FIGS. 4A-4D illustrate an alternate embodiment for forming a semiconductor having variable gate oxide thicknesses in the same substrate.

Figure 4A:
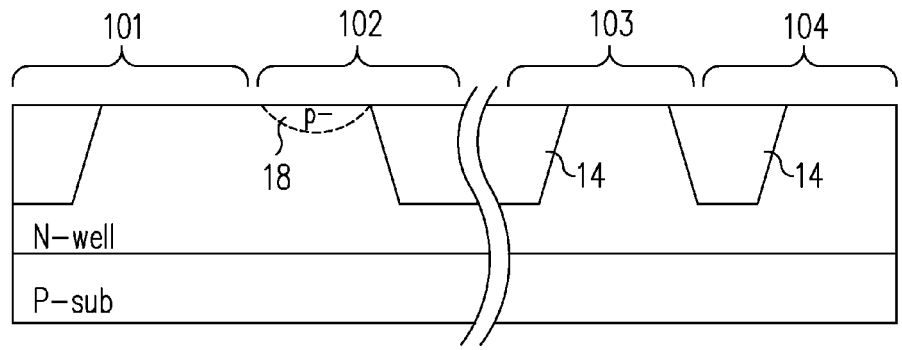
FIGS. 4A-4D are cross-sectional views of an alternate process flow for manufacturing planar DRAM cells embedded in active logic circuitry in accordance with a second embodiment of the invention.

FIGS. 4A-4D illustrate an alternative fabrication process for a planar DRAM cell. The initial steps of the process of FIGS. 4A-4D are the same as FIGS. 3A-3C. Similar features of each process are represented by the same reference numerals. After a first oxidation step that forms a sacrificial oxide layer, a p-type implantation is performed where the capacitor will be located (region 102). The p-type dopant is implanted at a dosage level ranging from $1 \times 10^{14}$ cm$^{-2}$ to $2 \times 10^{15}$ cm$^{-2}$. More preferably, the dosage level for the p-type implant will range from $5 \times 10^{14}$ cm$^{-2}$ to $1 \times 10^{15}$ cm$^{-2}$. FIG. 4A illustrates a semiconductor substrate after planarization of the oxide material 14, and after the p-type oxidation enhancing implantation 18. As in the case of the process of FIGS. 3A-3C, an n-type dopant may also be implanted after the p-type implantation. The n-type dopant is implanted at a dosage level that ranges from $10^{12}$ to $5 \times 10^{14}$ cm$^{-2}$.

Figure 4B:
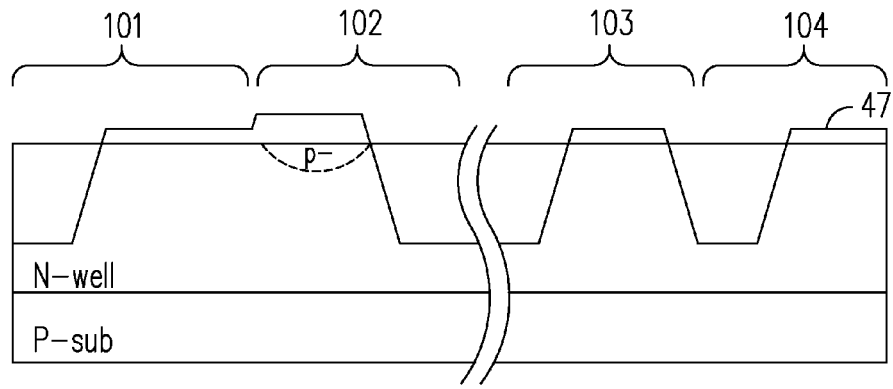
Figure 4C:
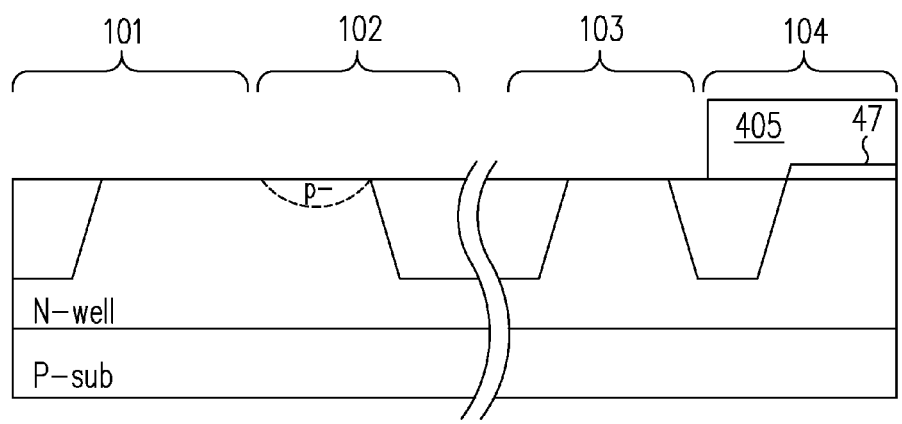
Figure 4D:
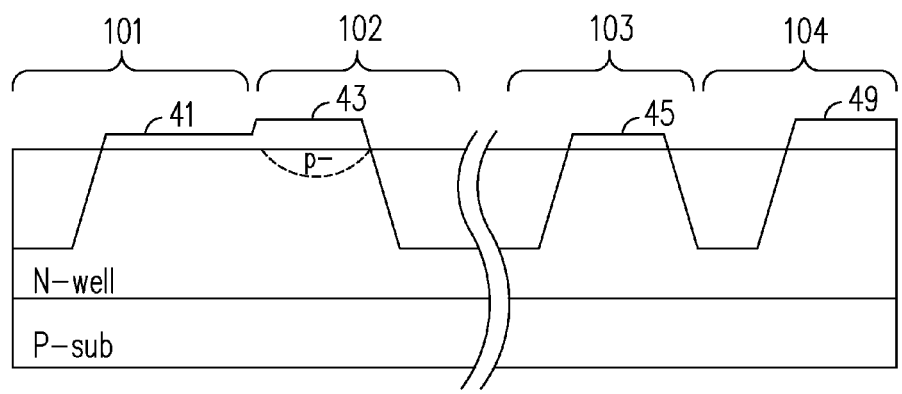

Thermal oxidation is then initiated to grow the oxide layer shown in FIG. 4B. The gate oxide of region 102 will be thicker than the other gate oxide portions because of the oxidation enhancing implant 18. Next a photoresist mask 405 is provided over region 104 of the future I/O device. Due to mask 405, the oxide of the I/O region is grown in two oxidation steps to form gate oxide 49—shown in FIG. 4D. Thereafter, the oxide layer in regions 101-103 is stripped to produce the structure of FIG. 4C. Then photoresist 405 is removed and the entire structure is subject to thermal oxidation. As a result, a new oxide layer is grown above regions 101-103, and the oxide in I/O region 104 increases in thickness. In other words, the gate oxide of the I/O region is formed in multiple oxidation steps. First, in the oxidation of FIG. 4B when 47 is formed and then in the oxidation that resulted in 41, 43, and 45 being formed. The resulting structure shown in FIG. 4D has a thickness of approximately 15-28 Å for gate oxide 41 of the access transistor, 30-40 Å for the capacitor dielectric 43, 15-28 Å for the logic gate dielectric 45; and for the I/O gate, a gate oxide 49 of approximately 50-70 Å. Subsequent steps of depositing and masking a polysilicon layer, and providing spacers and implanting source and drain regions are performed in a conventional manner.

Figure 5A:
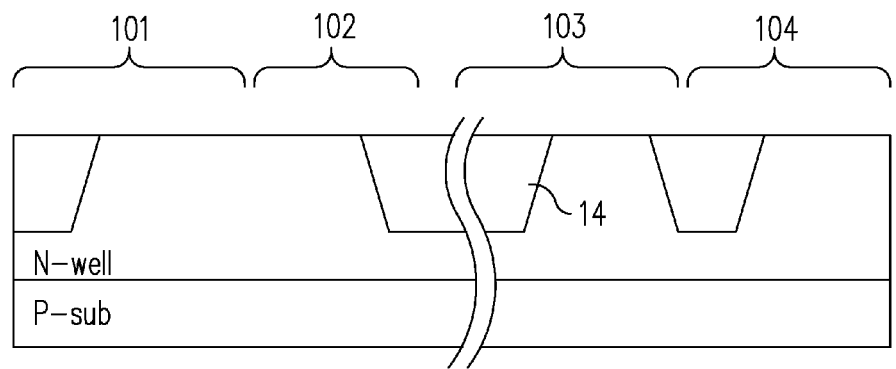
FIGS. 5A-5E are cross-sectional views of an alternate process flow for manufacturing planar DRAM cells embedded in active logic circuitry.
Figure 5B:
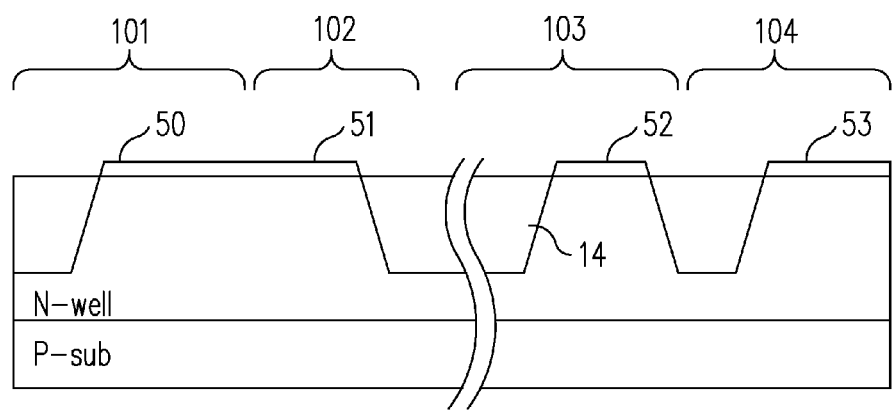
Figure 5C:
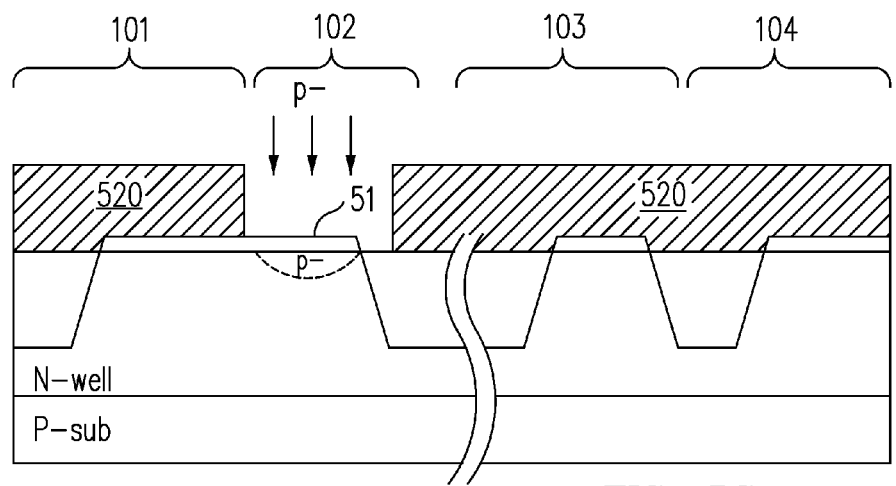
Figure 5D:
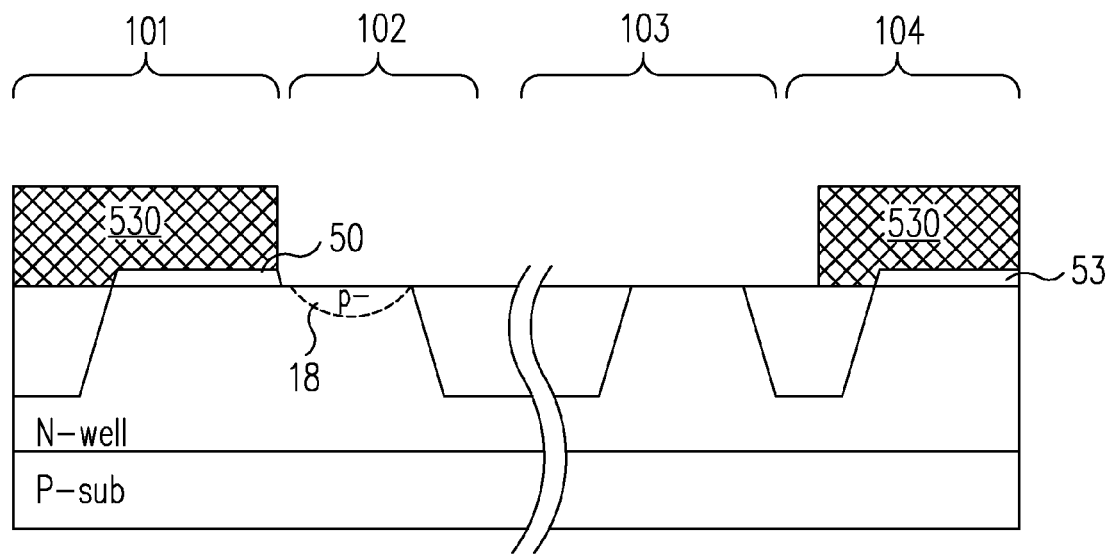

Yet another process for fabricating an embedded planar DRAM cell with multiple oxide thicknesses is shown in FIGS. 5A-5E. The process of FIGS. 5A-5E is the preferred embodiment of this invention. FIG. 5A illustrates an embedded DRAM formed within an N-well on a P-substrate. Conventional STI technology is used to isolate areas 101, 102, 103, and 104. The access transistor will be located in area 101, and the capacitor will be located in area 102. Furthermore, logic circuitry will be located in area 103, and I/O circuitry will be located in area 104. A first oxide layer of equal thickness is grown on areas 101, 102, 103, and 104 and designated as oxide portions 50-53 in FIG. 5B. Subsequently, a mask 520 is placed on either side of capacitor dielectric area 102 and a p-type dopant is implanted through oxide layer 51 as illustrated in FIG. 5C. Optionally, an n-type dopant may be implanted as in the embodiment of FIG. 3. Then, mask 520 is removed and replaced with a single mask 530, while oxide regions 51 and 52 are removed to produce the structure of FIG. 5D.

Figure 5E:
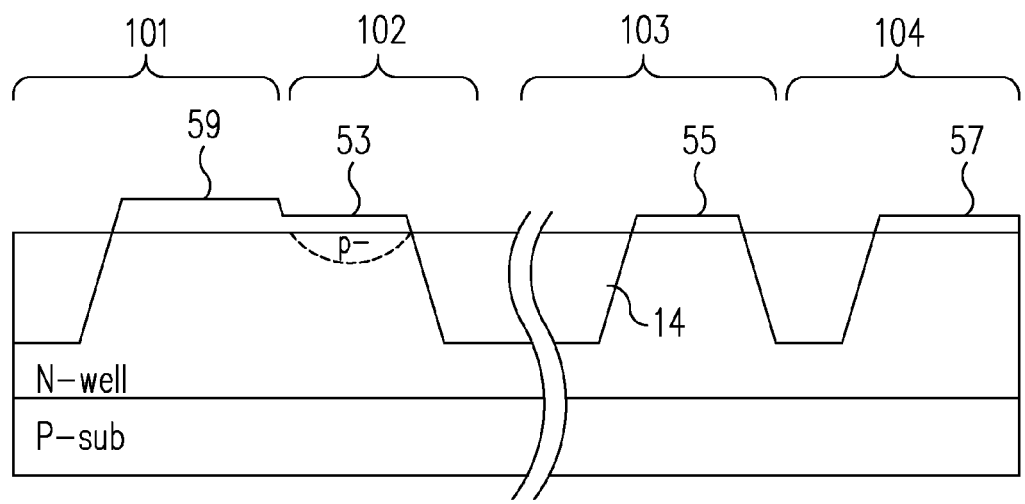

Next, mask 530 is stripped to subject the entire substrate to thermal oxidation. When mask 530 is stripped, oxide regions 50 and 53 remain present in access region 101 and I/O region 104. During thermal oxidation, preexisting oxide regions 50 and 53 are made even thicker to become oxide regions 59 and 57, while new oxide regions 53 and 55 are simultaneously formed. Capacitor dielectric 53 will be thicker than oxide region 55 due to the presence of the oxidation enhancing implant 18, resulting in the structure of FIG. 5E. In the embodiment of FIG. 5E, the access transistor will have an oxide thickness 59 between 48-100 Angstroms and more preferably of 50-70 Angstroms. The capacitor oxide region 53 has a thickness of approximately 30-40 Angstroms, and the logic area 103 will have an oxide region 55 of approximately 15-28 Angstroms. Finally, 57 in FIG. 5E corresponds to the oxide region of the I/O transistor which has a thickness between 48-100 Angstroms, and more preferably between 50-70 Angstroms.

As is apparent from FIGS. 5A-5E, only two oxidation steps are needed to produce a structure with three different dielectric thicknesses. The preferred embodiment of FIGS. 5A-5E avoids the standard third oxidation step by incorporating an oxidation enhancing implant 18. Even with implant 18, this embodiment does not require any more masking steps than conventional processes that form multiple gate oxides without an oxidation-enhancing implant.

Several variations to the process of FIGS. 5A-5E are possible. For example, after stripping mask 520 the second mask 530 may only cover I/O transistor region 104 instead of both regions 101 and 104. In this alternate embodiment the gate oxides of the access transistor and the logic are formed with an equal thickness in regions 101 and 103. Consequently, the final oxide portions of this embodiment resemble the structure shown in FIG. 4D. Thus, this alternate embodiment modifies the DRAM cell by using mask 530 in the manner of mask 405 in FIG. 4C.

Additionally, it is not essential for the oxidation enhancing implant shown in FIG. 5C to occur after the first oxidation step of FIG. 5B, in which regions 50-53 are formed. The oxidation enhancing implant 18 can instead precede the first oxidation step of FIG. 5B. In this alternate embodiment, the silicon substrate is masked to expose capacitor region 102, and the oxidation enhancing implant is provided to form a shallow doped region 18 as illustrated in FIG. 3D. Specifically, introducing an oxidation enhancing implant into bare silicon before oxidation is shown in FIGS. 3D-3F. When the oxidation enhancing implant occurs prior to the first oxidation step, FIG. 5B will thus resemble the oxide thickness ranges shown in FIG. 3E. Of course, FIG. 5C would not be relevant since the oxidation implant occurs immediately after FIG. 5A in this alternate embodiment. In other words, FIGS. 5B and 5C would be replaced with FIGS. 3D and 3E in this alternative embodiment.

In a yet another variation to the embodiment of FIGS. 5A-5E, the process can be implemented without forming the I/O gate dielectric 53. In this embodiment, regions 50, 51, and 52 comprise sacrificial layers that are absent in the final structure. Additionally, this embodiment would dispense with mask 530 such that dielectric 53 and the gate oxide of regions 55 and 59 are formed concurrently. In the final structure, regions 55 and 59 have the same gate oxide thickness, while region 53 will have a thickness greater than either region 55 and 59 due to the oxidation enhancing implant 18.

In the process of FIGS. 5A-5E, and each of the variations to the process of FIGS. 5A-5E, the conductivity types of the various semiconductor regions can be reversed. For example, the process of FIGS. 5A-5E, in addition to the alternate embodiments can each be implemented in a P-well on an n-substrate, as opposed to an N-well on a P-substrate.

The logic process of the present invention is also applicable to 1T-SRAM cells having a folded area capacitor which are disclosed in U.S. Pat. No. 7,323,379 by Dennis Sinitsky and Fu-Chieh Hsu, entitled "Fabrication Process for Increased Capacitance in an embedded DRAM Memory," which is incorporated herein by reference.

Figure 6A:
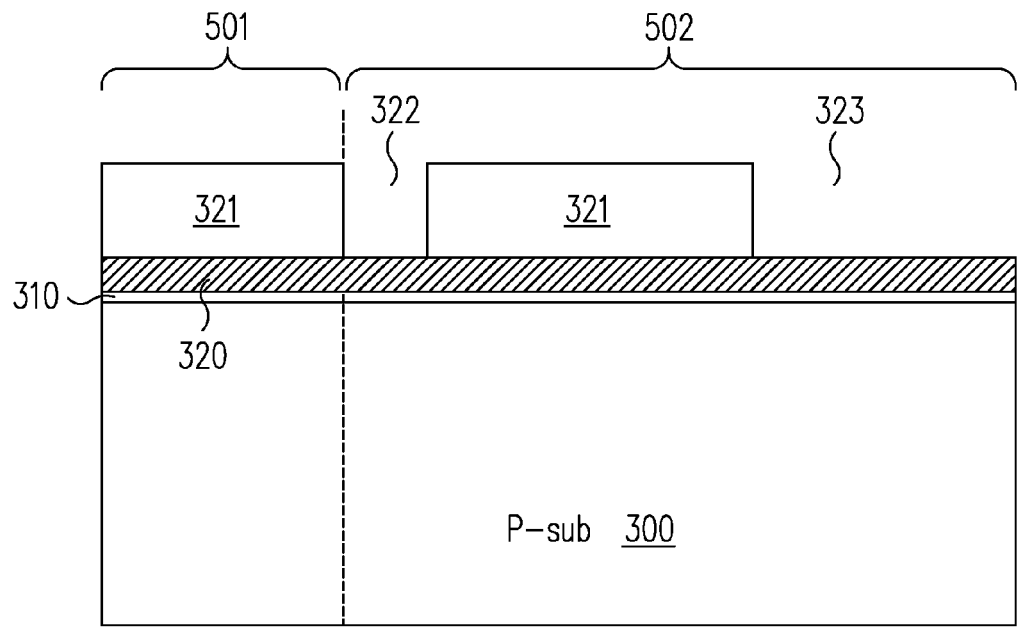
FIGS. 6A-6N are cross-sectional views of a process flow for manufacturing quad-density DRAM cells embedded in active logic circuitry.
Figure 6B:
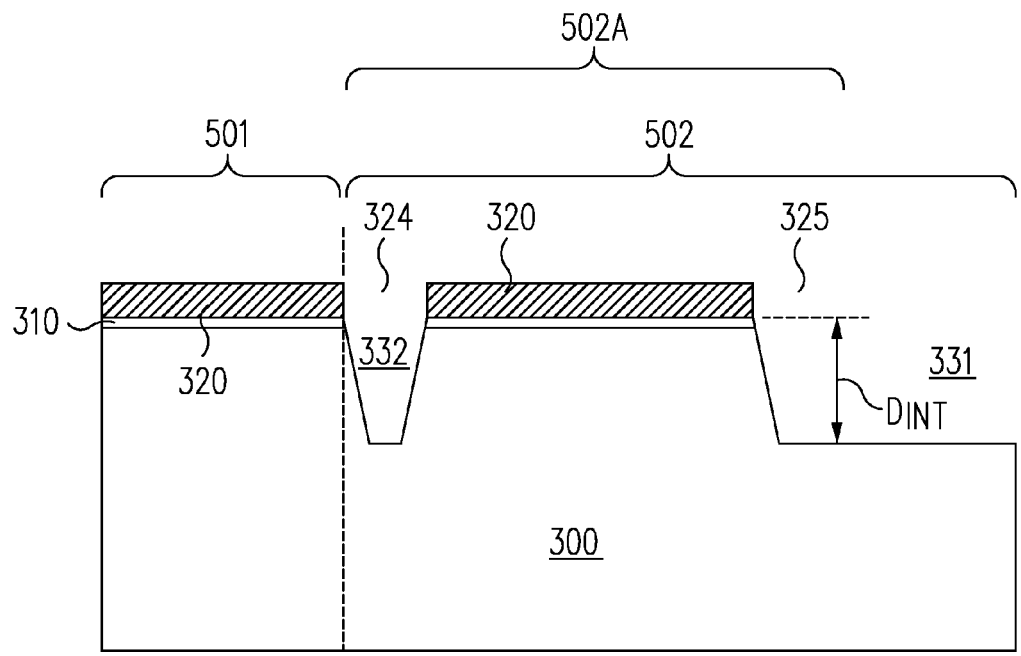
Figure 6C:
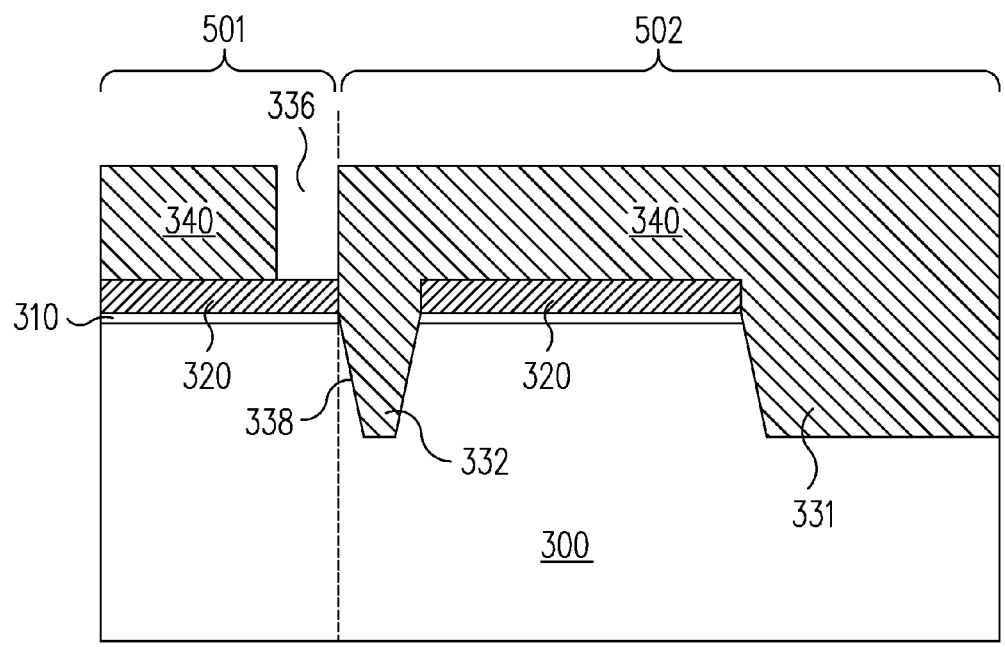
Figure 6D:
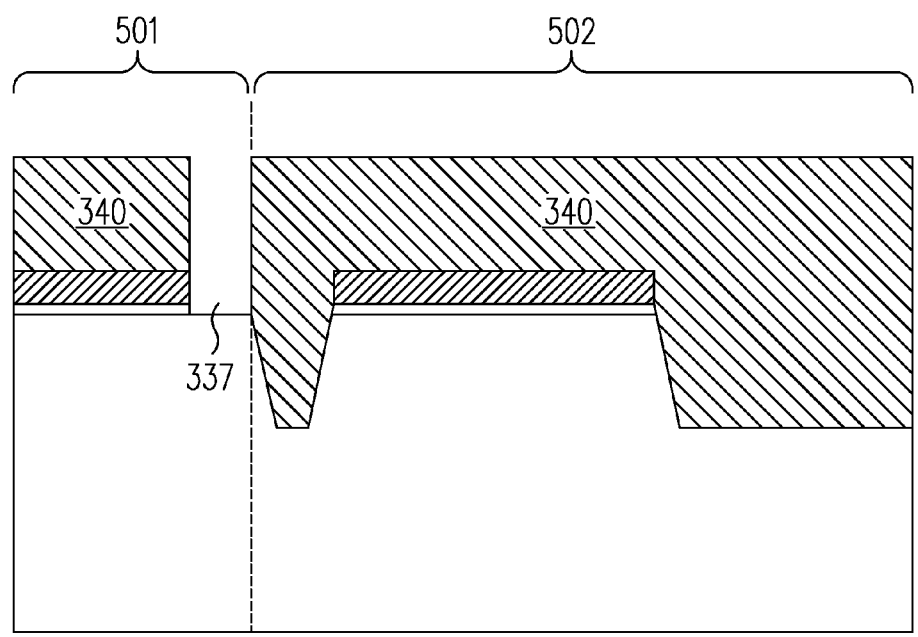
Figure 6E:
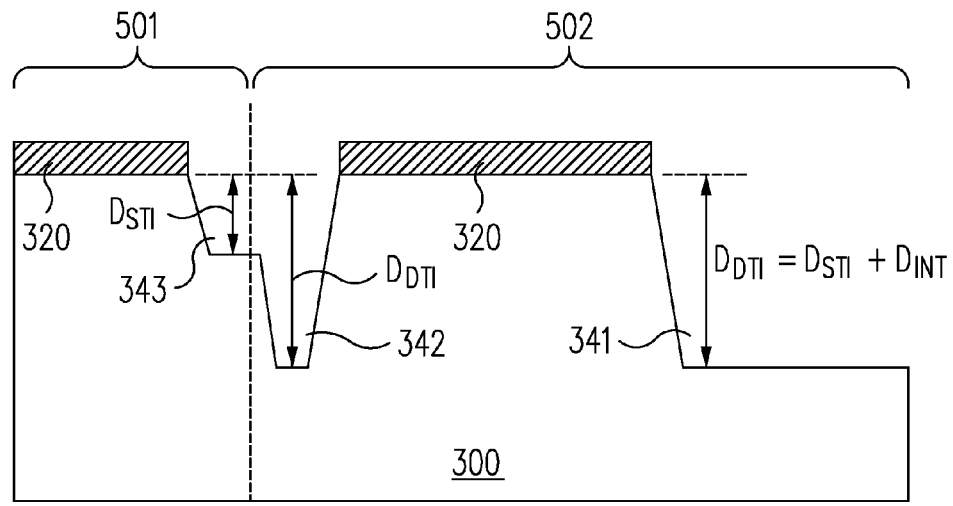
Figure 6F:
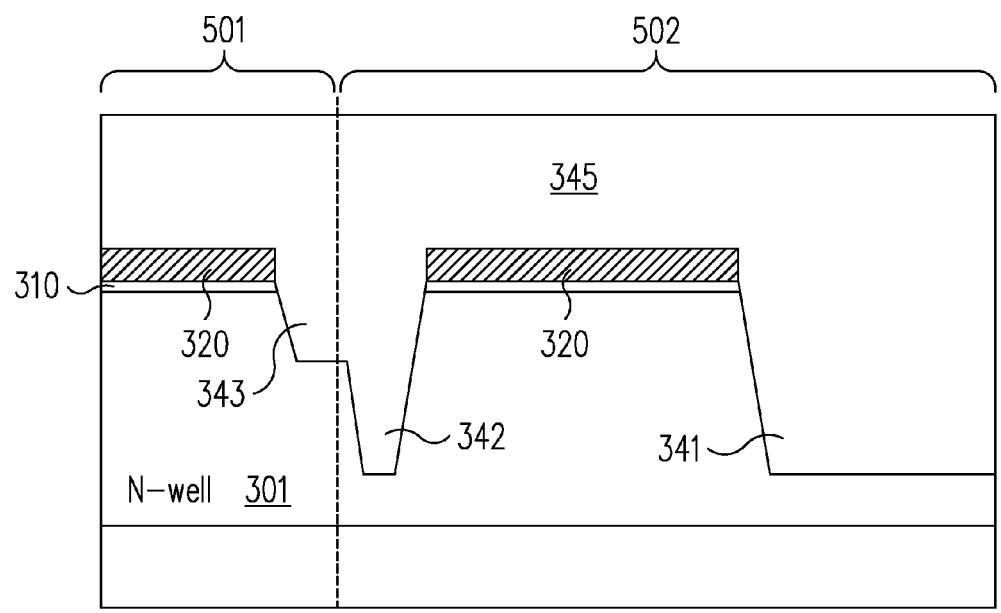
Figure 6G:
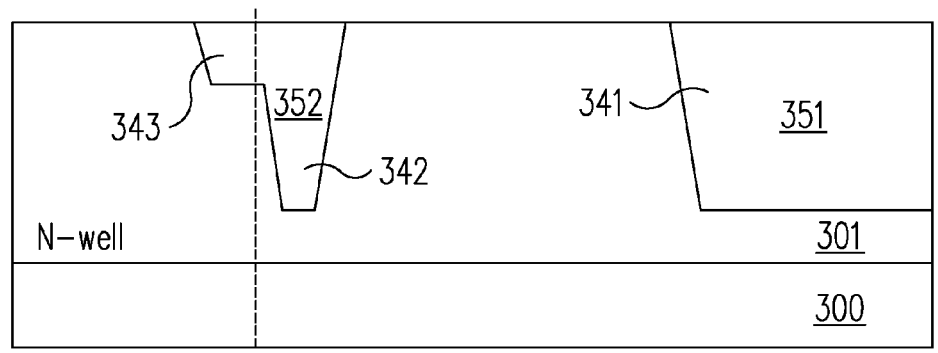
Figure 6H:
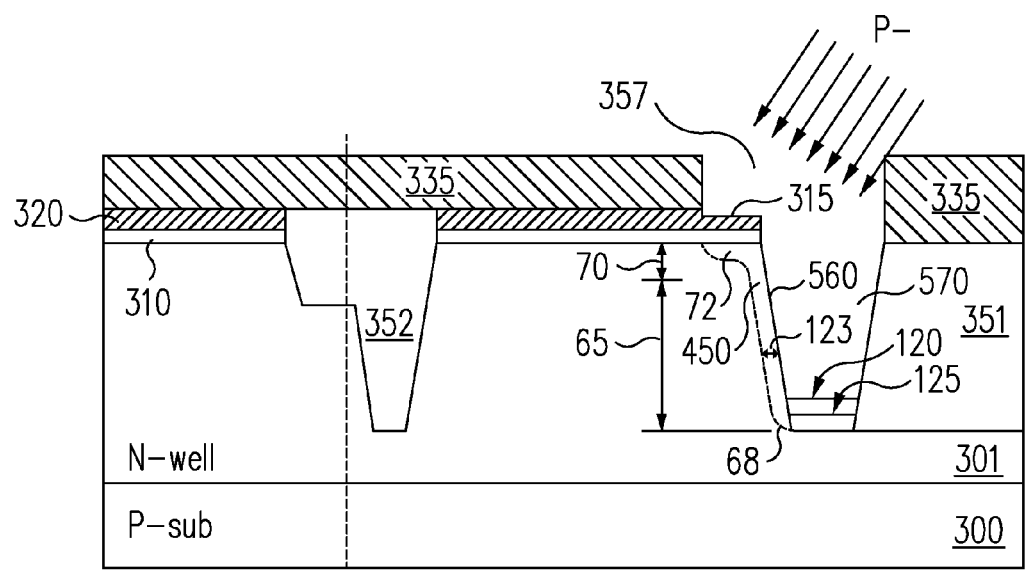
Figure 6I:
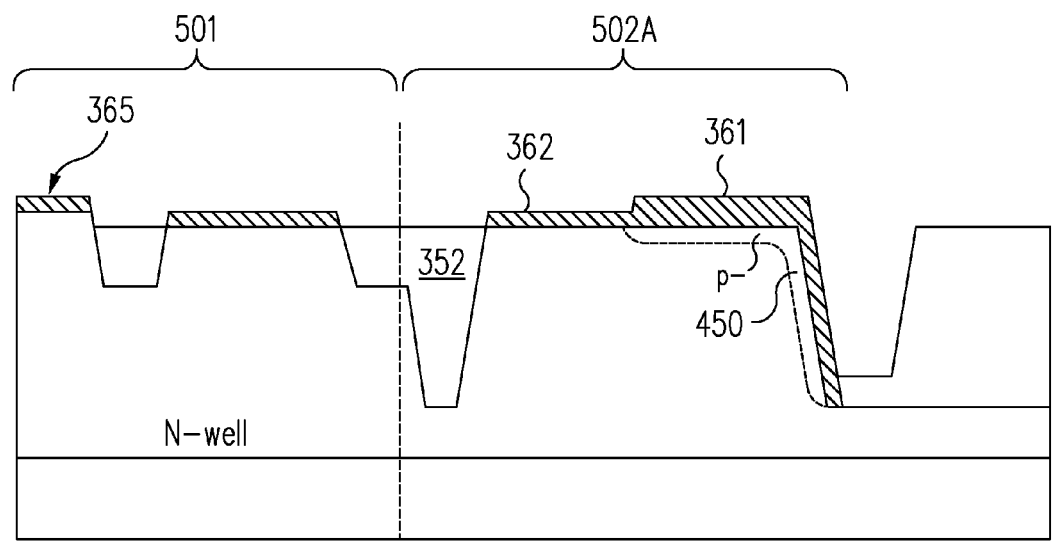
Figure 6J:
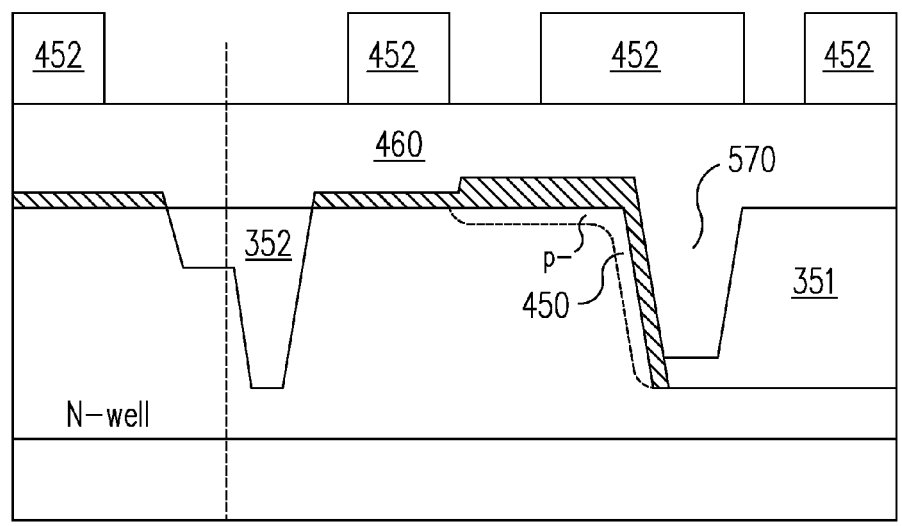
Figure 6K:
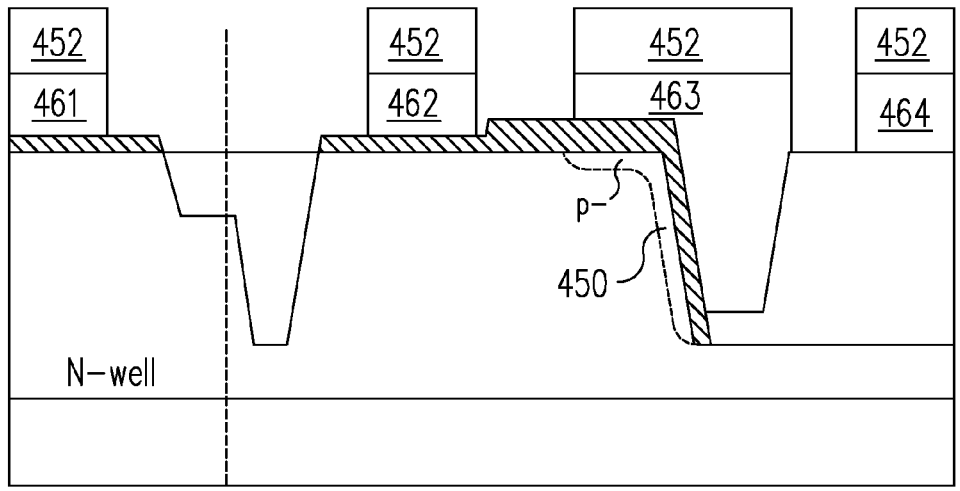
Figure 6L:
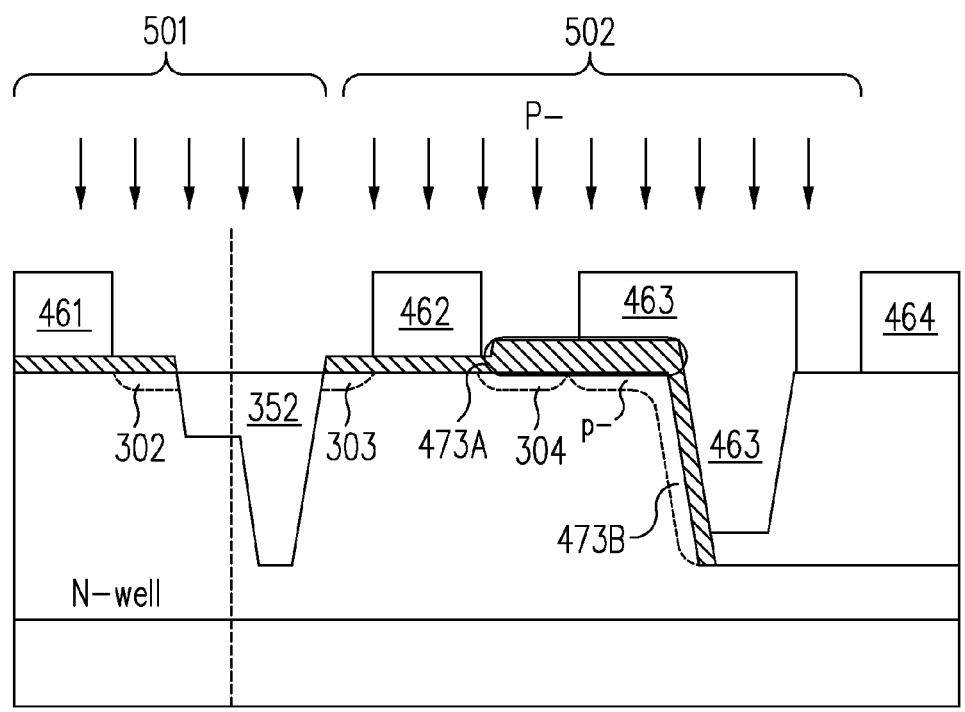
Figure 6M:
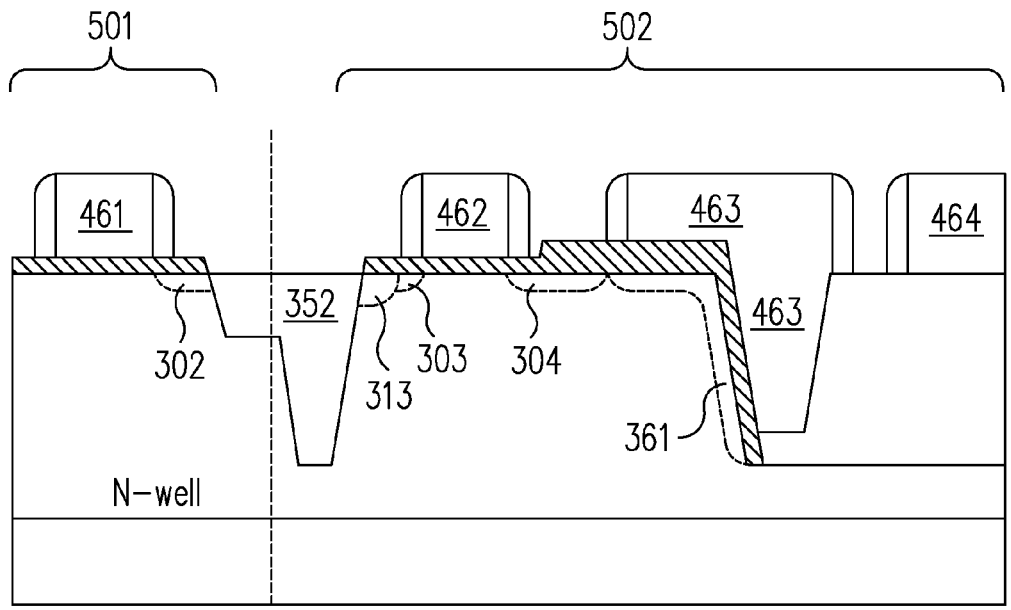
Figure 6N:
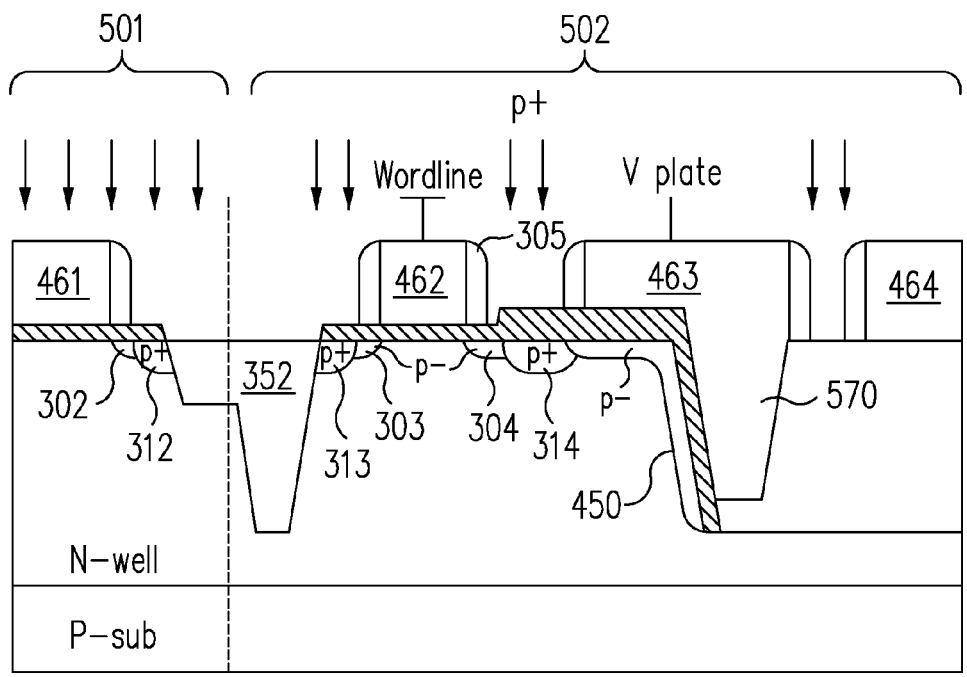

FIGS. 6A-6N are cross sectional views of a Quad-density DRAM cell (also referred to as Q-cell) and a conventional logic transistor during various stages of fabrication in accordance with yet another embodiment of the present invention. In this Q-cell embodiment, fewer masking steps and thermal cycles are used to produce a structure having various gate oxide thicknesses. A reduced amount of processing steps minimizes the need for adjustments that will return the logic devices to their original characteristics prior to being integrated with the DRAM devices. In other words, the logic devices of the embedded memory are preserved by the present invention. Therefore, the present invention enables the construction of an embedded memory without altering the character of the logic devices.

FIG. 6A shows a p-type semiconductor substrate 300, which is separated into a logic device region 501 and a DRAM cell array region 502. Logic device region 501 is designated as all area in the non-memory part of the integrated circuit, as well as the area of the DRAM memory circuitry that does not include the DRAM cell array. First, a buffer oxide layer 310 is disposed on substrate 300. Thereafter, a hard mask layer 320, such as silicon nitride, is formed over buffer oxide layer 310. A photoresist layer 321 is then deposited over hard mask film 320. This photoresist layer 321 is exposed and developed to create openings 322-323. Openings 322-323 define the locations of isolation regions that are later formed in the memory area. An etch is performed through openings 322-323, to form corresponding openings 324-325 through the exposed portions of hard mask layer 320 (FIG. 6B). Photoresist layer 321 may then be stripped.

An initial trench etch can be done with or without mask 321 through openings 324-325 in hard mask layer 320. That is, layer 321 may be stripped after the etching process. In the case of FIG. 6B, the trench etch occurs after photoresist 321 has been stripped. This etch forms initial trenches 331-332, each having an intermediate depth equal to $D_{INT}$. In a subsequent process step, trenches 331-332 are subsequently made deeper as described below.

Then a photoresist layer 340 is formed over the resulting structure as shown in FIG. 6C. Photoresist layer 340 is exposed and developed to form opening 336. Opening 336, which is aligned with an edge of intermediate depth trench 332, exposes a portion of the underlying hard mask layer 320. It is critical that mask 340 in area 502 be precisely aligned with the upper surface of the sidewall 338 of trench 332. If mask 340 extends too far to the left of trench 332 in FIG. 6C, then a portion of nitride layer 320 from area 501 will remain. If mask 340 is positioned too far to the right so that it does not completely cover trench 332, then the integrity of the sidewall 338 will be disturbed. In other words, if mask 340 is misaligned so that a portion of sidewall 338 is exposed, sidewall 338 will be disturbed during etching. Consequently, an undesired crook will be formed, and polymeric residue from the etching process will become trapped therein. Next, opening 336 is etched to form an opening 337 through the exposed portion of hard mask layer 320 resulting in the structure shown in FIG. 6D.

Photoresist layer 340 is then stripped, and a conventional shallow trench isolation (STI) etch is performed through opening 337 to a depth of $D_{STI}$, as shown in FIG. 6E. At this time, intermediate depth trenches 331-332 are made deeper by an amount approximately equal to $D_{DTI}$, thereby forming deep trenches 341-342. These deep trenches 341-342 have a depth $D_{DTI}$ as shown in FIG. 6E, which is approximately equal to $D_{INT}+D_{STI}$. Shallow trench 343, having a depth of $D_{STI}$, is formed in the location previously defined by opening 336 of photoresist mask 340. In the described embodiment, the chemical etch causes the sidewalls of trenches 341-343 to exhibit angles of less than 90 degrees.

In another embodiment of the present invention, completely separate lithography and etch steps can be used to define shallow trench 343 and deep trenches 341-342. In yet another embodiment, it is not essential to form the trench depth in multiple steps. That is, the trenches can be etched to a single depth in one step, such that the formation of intermediate depth, $D_{INT}$, is optional.

As shown in FIG. 6F, a dielectric layer 345, such as silicon oxide, is then deposited over the resulting structure, thereby filling trenches 341-343 and covering hard mask layer 320. A chemical-mechanical-polishing (CMP) planarization step is then performed to planarize dielectric layer 345, with hard mask layer 320 acting as a stopper layer, in a manner consistent with manufacturing of shallow-trench-isolation (STI) in a conventional logic process. As shown in FIG. 6G, at the end of the CMP planarization step, the upper surfaces of the dielectric layer 345 are substantially co-planar with the upper surface of substrate 300. The portion of dielectric layer 345 remaining in deep trench 341 is labeled as dielectric region 351. The portion of dielectric layer 345 remaining in shallow trenches 342 and 343 is labeled as dielectric region 352.

Sacrificial oxidations and well and threshold voltage adjust implants are then performed in a manner consistent with the conventional logic process, notably forming N-well 301 of the DRAM array. In one embodiment, N-well 301 is formed by a conventional process step such as ion implantation, and has a dopant concentration of about $1\times10^{17}/cm^3$. Although no logic regions outside of N-well 301 are shown in FIG. 6G, the existence of such regions is evident to one of ordinary skill in the art. In another embodiment of the present invention, the DRAM cell array can be fabricated in a P-type triple-well and employ NMOS transistors. In this case, a deep N-type well and a triple P-type well are fabricated in place of N-well 301.

Turning now to FIG. 6H, buffer oxide layer 310 and silicon nitride layer 320 are preferably retained from the STI processing step. In the described embodiment, oxide layer 310 is silicon oxide having a thickness in the range of about 5 to 20 nm. However, this thickness can vary depending on the process being used.

Photoresist mask 335 is provided on the structure of FIG. 6H. A portion of nitride layer 320 remains on the surface of the substrate to enable ions to be implanted along the sidewall edge 560 of cavity 570 to form doped region 450. Photoresist 335 has an opening 357, that is formed over nitride layer 320 and oxide layer 310 using well known processing techniques. Opening 357 is located partially over n-well 301 and partially over field dielectric region 351. As illustrated in FIG. 6H, an etch is performed through opening 357 to partially remove the exposed portion of nitride layer 320, and the exposed portion of dielectric region 351, to thereby form a cavity 570 in dielectric region 351.

The nitride layer 320 in the portion of opening 357 is removed during the oxide etch that forms cavity 570. Since the etch selectivity between nitride and oxide is less than infinity, some of the remaining nitride layer 320 will be thinner than the nitride layer below mask 335. Ideally, the etch selectivity must be chosen to produce thin nitride portion 315 adjacent to cavity sidewall 560. Nitride portion 315 serves as a mask to enable an oxidation enhancing implant to be introduced at this time. In particular, dopant is implanted into silicon at a controlled depth 70 to form shallow region 72 beneath oxide layer 310.

Consequently, nitride portion 315 facilitates formation of doped region 70, while sloped sidewall 560 facilitates formation of doped region 65 adjacent to sidewall 560. When the depth of region 65 is measured perpendicular to sidewall 560, implanted region 65 can be considered as having a depth similar to the depth of implanted region 70. In a preferred embodiment the nitride:oxide selectivity rate will range from 1:3 to 1:10.

The oxidation enhancing implant must take place prior to formation of the gate oxide layers. Preferably, the oxidation enhancing implant is performed prior to forming any type of conductive layers, such as polysilicon. It should be clear that the oxidation enhancing implant does not serve as either the source or drain region of any of the devices.

In a preferred embodiment, the oxidation enhancing implant is performed at an angle greater than zero degrees from the normal to the substrate surface, and has a p-type conductivity. This ion implant is performed through opening 357 of photoresist mask 335 as shown in FIG. 6H. In one embodiment, boron is implanted at a dosage of $2\times10^{14}/cm^2$ to $1\times10^{15}/cm^2$, and at an energy of 10-30 KeV. In a more preferred embodiment, the dosage levels of the boron implant ranges between $5\times10^{14}$ to $1\times10^{15}/cm^2$. Of course, any type of p-type dopant is suitable for the oxidation enhancing implant, and it is understood that boron is simply used as an example in the description of the present process. As in the case with the process of FIGS. 3A-3C, an n-type dopant may also be implanted after the p-type implantation. The n-type dopant is preferably implanted at a dosage level of $1\times10^{13}$ to $5\times10^{14}cm^{-2}$.

The P-type implant described in the previous paragraph results in the formation of P-region 450. P-region 450 makes the threshold voltage under the subsequently formed capacitor structure more positive, such that the capacitor structure can be turned on more easily. That is, P-region 450 helps to invert the substrate adjacent to the cell capacitor electrode and boost performance of the resulting DRAM cell. In the embodiment where a triple-P-well structure is used in place of N-well 301, the P-implant is replaced with an N-implant, thereby resulting in an N-inversion layer. It is understood that the conductivity types of the various regions and the bias polarities can be reversed in other embodiments to achieve similar results.

The p-type implant of FIG. 6H extends deep enough vertically so as to penetrate the top surface of oxide 120 within opening 357. Later, during removal of oxide layer 310 a portion of the oxide in cavity 570 is removed, resulting in a deeper cavity defined at the bottom surface by 125. However, current leakage is prevented due to the presence of a p-type implant at the lower sidewall edge 68 of opening 357, adjacent to bottom surface 125.

FIG. 6I further illustrates a structure that has been stripped of photoresist mask 335, silicon nitride layer 320 and buffer oxide layer 310. Gate dielectric layers 361 and 362 are then simultaneously grown over the upper surface of the resulting structure. In a single oxidation step, dielectric layers 361 and 362 are thermally formed. The method of this aspect of the invention is advantageous because it reduces the number of required masking steps to form dielectric layers 361 and 362. For example, had this method not been used, it would be possible to form oxide regions 361 and 362 in a plurality of oxidation steps. In the absence of doped region 450, an additional masking step is necessary to obtain oxide regions 361 and 362. Specifically, a first oxidation step may be employed to oxidize regions in area 502A to produce an oxide layer having the same thickness. Then, a mask is provided in area 502A over 361, to leave an exposed region. The oxide in the exposed region of 502A is later removed. Thereafter, the mask covering region 361 must be removed. Next, all of 502A is again oxidized to form region 362. In this complicated manner, region 361 is formed with a thicker oxide layer than region 362.

As can be observed from FIG. 6I, a simpler process in accordance with this invention, simultaneously produces regions 361 and 362 with dielectric layer 361 having a greater thickness than gate dielectric layer 362. In the described embodiment, dielectric layer 361 has a thickness of approximately 32-38 Angstroms, gate dielectric layer 362 preferably has a thickness in the range of about 15-28 Angstroms. In this embodiment, the gate dielectric layer for the I/O portion 365 is grown in the manner shown in FIGS. 3-5. The gate dielectric 365 for the I/O has a thickness of 50-70 Angstroms and is located in region 501 as shown in FIG. 6I. In order to simplify the figures, the I/O dielectric is omitted from FIGS. 6J-6N, although it is understood that an I/O dielectric is present in the actual device manufactured by the process of the present invention. Despite the preferred ranges for the dielectric regions provided above, the thickness for dielectric layers 361 and 362 can vary depending on the process that is used. In the described embodiment, oxide layer 361 of the capacitor and oxide layer 32 of the access transistor are grown at the same time. However, in other embodiments, different layers can be used to form the gate dielectric layer of the access transistor and the capacitor dielectric layer. Consequently, the gate dielectric layers 361 and 362 can either be identical, or different in composition.

From this point forward, the conventional logic process is resumed. Specifically, a layer of polycrystalline silicon 460 having a thickness in the range of about 100 to 300 nm is deposited over the structure of FIG. 6I. Consequently, polysilicon layer 460 substantially fills cavity 570 as shown in FIG. 6J. Photoresist mask 452 is then formed over polysilicon layer 460 to define various electrode regions. In particular, photoresist mask 452 defines the gate electrode of the access transistor, an electrode of the cell capacitor, and a gate electrode of a logic transistor.

Polysilicon layer 460 is etched through photoresist mask 452 to thereby form logic gate electrode 461, memory access gate electrode 462, capacitor electrode 463 and another electrode/element 464. A portion of capacitor electrode 463 remains in cavity 570 as illustrated in FIG. 6K. By forming portions of capacitor electrode 463 on the sidewall of cavity 570, the area of incidence between capacitor electrode 463 and capacitor region 450 (i.e., the area of the capacitor) is made relatively large, while the required layout area of capacitor electrode 463 is made relatively small.

At this point, photoresist mask 452 is stripped, and a P-type ion implant is performed onto the structure of FIG. 6L. As a result, lightly doped P-type source/drain regions 302-304 are formed in n-well 301. Conspicuously, P-type source/drain region 304 is continuous with capacitor region 450. In addition, polysilicon regions 461-464 receive p-type impurities during this implantation step.

As illustrated in FIG. 6M, sidewall spacers 305 are formed on the resulting structure. Sidewall spacers 305 are formed using a conventional fabrication process. For example, sidewall spacers 305 can be formed by depositing a silicon nitride layer over the resulting structure, and then performing an anisotropic etch on the silicon nitride layer using conventional processing techniques. After the anisotropic etch is complete, spacers 305 remain.

After sidewall spacers 305 have been formed, a P+ photoresist mask (not shown) is used to define the locations of the desired P+ regions on the chip. A P+ type ion implant is then performed, to produce the P+ source/drain regions 312, 313 and 314 (as well as the other desired P+ regions on the substrate) of FIG. 6N. The P+ type ion implant further dopes polysilicon regions 461-464. Sidewall spacers 305 prevent the P+ impurity from being implanted in lightly doped source/drain region 304. Optionally, the P+ photoresist mask (not shown) can include a portion that prevents the P+ impurity from being implanted into lightly doped source/drain region 304. An annealing thermal cycle is subsequently performed to activate the implanted impurities in regions 302-304, 312-313 and 450.

Additional processing steps corresponding to those shown in FIGS. 3M-3P of U.S. Pat. No. 7,323,379 may be implemented after the processing step of FIG. 6N.

Figure 7A:
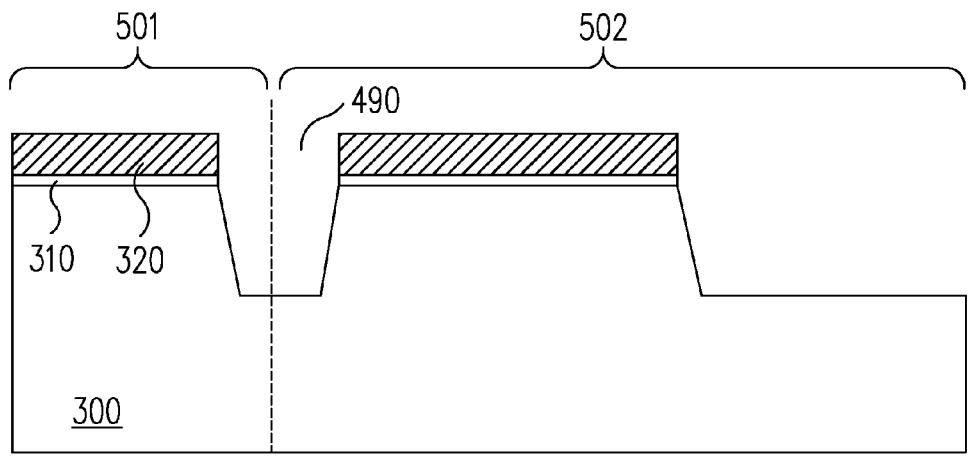
FIGS. 7A-7C illustrate an alternate embodiment for forming isolation regions for the quad-density embedded DRAM cell.
Figure 7B:
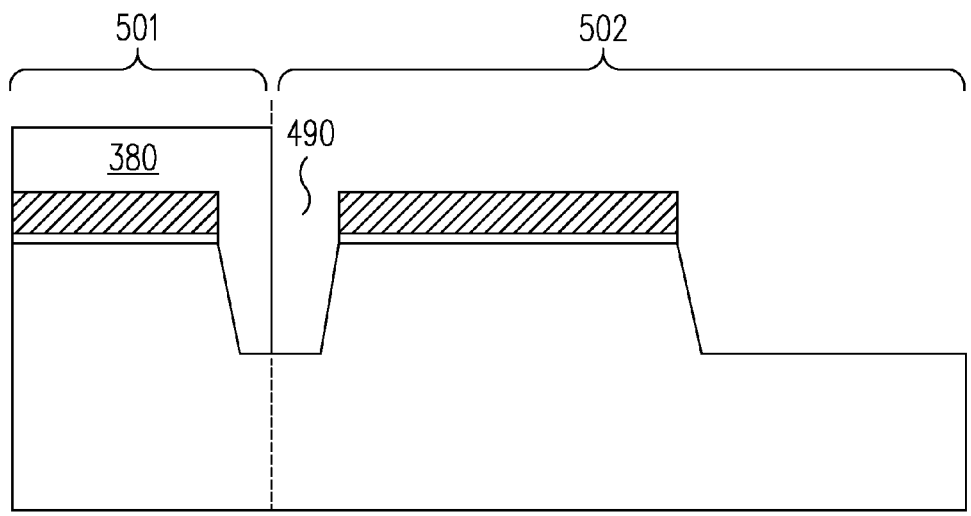
Figure 7C:
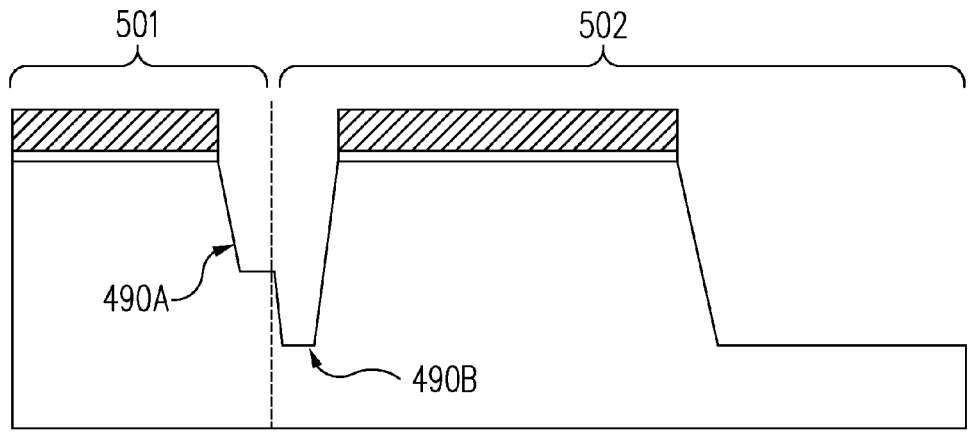

FIG. 7A-7C illustrates yet another method of forming the trenches in the Q-cell version of the invention. The advantage of this method is that it provides greater tolerance for misalignment than the trench formation in FIGS. 6B-6E. More specifically, FIG. 7A illustrates a shallow trench that is formed between logic area 501 and memory area 502. Then as shown in FIG. 7B, a mask 380 is placed over hard mask 320 in logic area 501 to protect a portion of trench 490. Afterwards, the exposed portion of trench 490 is etched deeper, resulting in the trench 490 of FIG. 7C. As illustrated in FIG. 7C, trench 490 is defined by a first and a second depth. The second depth 490B is deeper than the first depth 490A. In conclusion, the steps illustrated in FIG. 7A-7C can be substituted for the process of FIG. 6B-6E if there is a concern with meeting the stringent mask alignment requirements shown in FIGS. 6B-6E.

Figure 8:
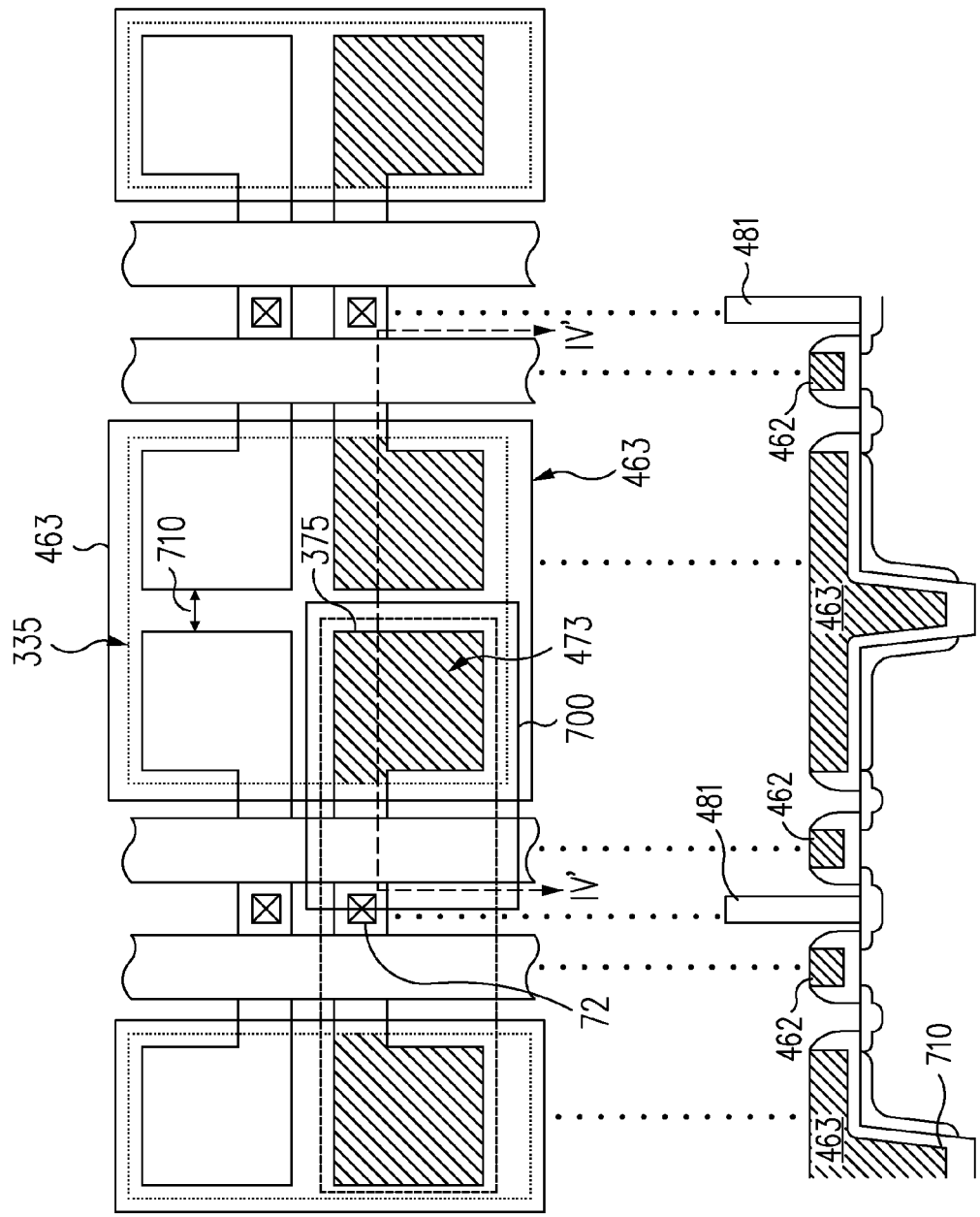
FIG. 8 illustrates a layout of the DRAM cell of the present invention and the corresponding cross-sectional view of the DRAM cell design.

The upper half of FIG. 8 illustrates a memory layout of an array of DRAM cells, including the DRAM cell 700. DRAM cell 700 generally corresponds to area 502 of FIG. 6L. Specifically, hatched region 473 is the capacitor dielectric in area 502 of FIG. 6L and region 462, between contact 72 and capacitor 473, corresponds to the access transistor 462 in FIG. 6L. In both the planar DRAM embodiment and the quad density embodiment, a mask 335 is desirable to selectively provide an oxidation enhancing implant into the well of a semiconductor substrate. Mask 335 covers two rows of memory cells. Within the area defined by mask 335 is located the oxidation enhancing implant, as well as trench 710. The oxidation enhancing implant of the invention enables the use of a positive bias voltage for DRAM cell 700. Section line IV-IV' corresponds to a middle portion 502A of FIG. 6B. Contact 72 connects source/drain region 313 of DRAM cell 700 to a bit line (not shown). Contact 72 also connects to the drain region of a symmetric DRAM cell located to the left of the present DRAM cell 700. In this manner, one contact provides a connection to two DRAM cells in an array.

Drain region 303 and source region 304 are separated by gate electrode 462 in FIG. 6N. Similarly, gate electrode 462 also separates drain region 313 from source region 314. The DRAM cell of FIG. 8 has a compact arrangement since cavity 710 is located outside of the cross-hatched regions but within the boundaries of mask 452. Thus, the portion of capacitor electrode 463 located within the cross-hatched regions 473 of FIG. 8 is at a higher elevation than the portion of capacitor electrode 463 located outside of region 473. The area of capacitor electrode 463 is accordingly maximized by extending over the sidewall defined by line 375 on the memory layout. FIG. 8 also illustrates that capacitor electrode 463 extends to adjacent DRAM cells as well.

The lower half of FIG. 8 illustrates a simplified cross-section of the layout that is also shown in FIG. 8. Polysilicon electrodes 463 are shown within trenches 710. Wordlines 462 are shown adjacent to bitline contacts 481 in the cross-sectional view of FIG. 8. The cross section of FIG. 8 exemplifies the compact layout achieved by the present invention.

The layout of FIG. 8 may also correspond to an array of DRAM cells having a planar configuration. The cross section of a planar DRAM cell is substantially similar to that shown in FIG. 8, except that the cavity of trench 710 is not filled with polysilicon 463 in a planar DRAM cell.

Due to the aforementioned logic process, the invention achieves multiple gate oxide thicknesses by using fewer masking steps than in the prior art. The invention also eliminates an oxidation step by simultaneously forming the gate oxide of the logic transistors and the gate oxide of the capacitors. Yet another advantage of the invention is the stability of the cell capacitance over a wide voltage range. In other words, the present invention provides a DRAM cell with a bias independent capacitance by modifying the logic process with an additional implantation step to yield multiple gate oxide thicknesses.

Figure 9A:
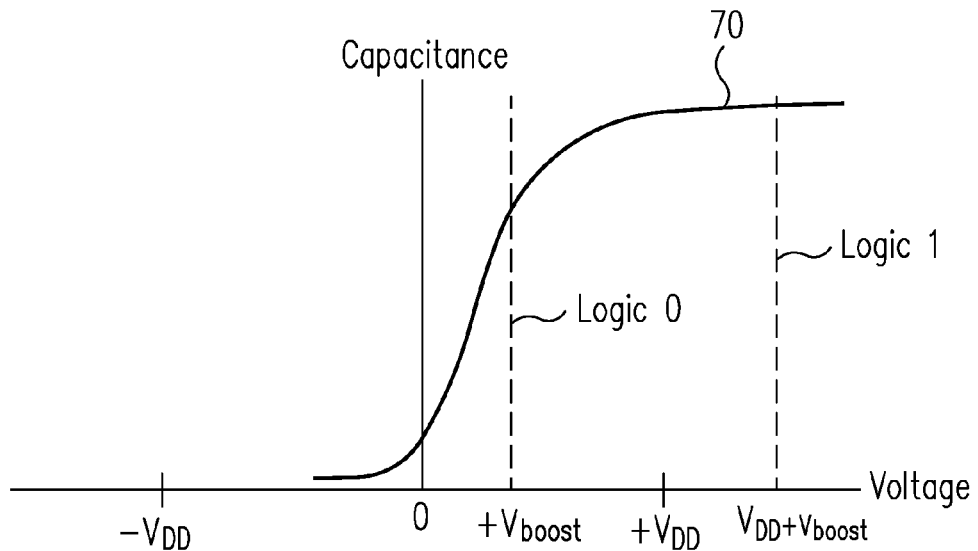
FIG. 9A illustrates the capacitance-voltage characteristics of a conventional capacitor in a logic process without an additional implantation of impurity.
Figure 9B:
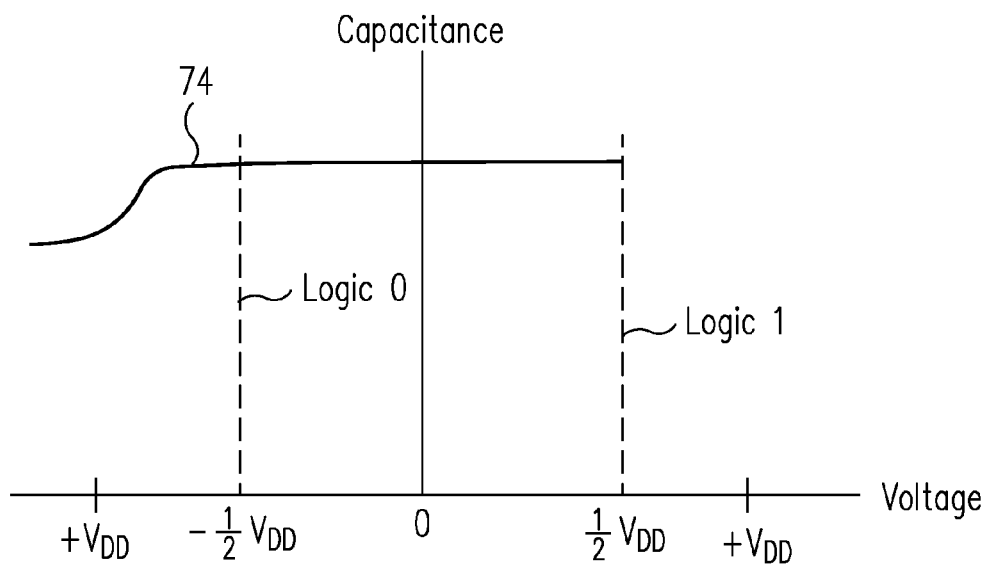
FIG. 9B illustrates the capacitance-voltage characteristics of an embedded DRAM in a logic process that includes an additional implantation of impurity.

Devices manufactured in accordance with the invention display greater linearity with respect to the applied voltage. The capacitance of devices manufactured using this process can be compared to the prior art by considering the C-V curves of FIGS. 9A and 9B. Curve 70 in FIG. 9A corresponds to the C-V curve of a conventional embedded DRAM cell. As described in U.S. Pat. No. 6,784,048 by Wingyu Leung and Fu-Chieh Hsu, entitled "Method of Fabricating A DRAM Cell Having A Thin Dielectric Access Transistor and a Thick Dielectric Storage," the gate of the PMOS storage transistor 302 receives a negative boosted bias voltage during operation. The disclosure of U.S. Pat. No. 6,784,048 is incorporated in its entirety herein. Traditionally, a negative voltage bias is applied to the capacitor in PMOS-based DRAM cells fabricated with a logic process. In conventional NMOS-based DRAMs, the voltage bias is positive and exceeds the power supply voltage, Vdd. The voltage boost is required to operate the capacitor in a more bias-independent portion of C-V curve 70, shown in FIG. 9A. Without the voltage boost of the prior art, curve 70 would reflect more of a bias dependent operation. When the cell stores a logic 1, the voltage across the capacitor dielectric will exceed $V_{dd}$ by the magnitude of the voltage boost. To counteract leakage through the capacitor it is traditional to employ a dielectric of 40 Angstroms or greater in thickness to ensure that the memory cell retains its data.

The present invention introduces a dopant between the first and second oxidation steps of a modified dual gate oxide process to alter the capacitance-voltage characteristics and thereby minimize the depletion layer effects. Specifically, dopant region 18 causes the C-V characteristic of the present invention to model C-V curve 74 in FIG. 9B, resulting in a relatively bias independent capacitance over the operating voltage range. Consequently, the capacitance of an embedded DRAM cell of the present invention is independent of the bias applied to the capacitor over a voltage range of $-\frac{1}{2}V_{dd}$ to $\frac{1}{2}V_{dd}$.

Therefore, the present invention allows for the application of a positive bias to the capacitor, regardless of whether the DRAM cell is constructed with PMOS or NMOS transistors. A storage capacitor constructed in accordance with this invention can store data successfully when provided with a storage node voltage between 0 and $V_{dd}$. In the case of the PMOS-based DRAM embodiment of this invention, there is no need to apply a boosted voltage to the wordline driver that is coupled to an access transistor having a thick gate oxide, when the access transistor is off. Preferably, the voltage bias on the PMOS transistor of a DRAM capacitor is simply $\frac{1}{2} V_{dd}$. In this case, the voltage across the storage capacitor is $\frac{1}{2}V_{dd}$ at either logic state, thereby enabling the use of a thinner capacitor dielectric. A smaller size capacitor may be employed if the capacitance is to be maintained at the same level as U.S. Pat. No. 6,784,048 that uses the boosted bias voltage. Similarly, if the DRAM capacitor is formed with an NMOS capacitor then the voltage bias of the storage node can also range between 0 and $\frac{1}{2} V_{dd}$.

The dynamic random access memory (DRAM) circuit of the invention stores either a logic high state (1) or a logic low state (0). The DRAM circuit is composed of a capacitor and an access transistor. In one embodiment, the access transistor can be constructed from PMOS transistors having a p-channel and a first p-type source/drain region and a second p-type source/drain region located in an n-well. In this embodiment, the capacitor is coupled to the second p-type source/drain region of the access transistor, and the capacitor includes a conductor overlying a portion of the n-well. A wordline driver is configured to apply a positive power supply voltage to the gate terminal of the access transistor when the DRAM circuit is not being accessed, or off. When a DRAM circuit constructed from PMOS transistors is being accessed, the wordline driver is configured to apply a voltage that is lower than the threshold voltage of the access transistor. When such a DRAM circuit (built from PMOS transistors) is not being accessed, the voltage applied to the access transistor is less than $V_{dd}$.

Figure 10:
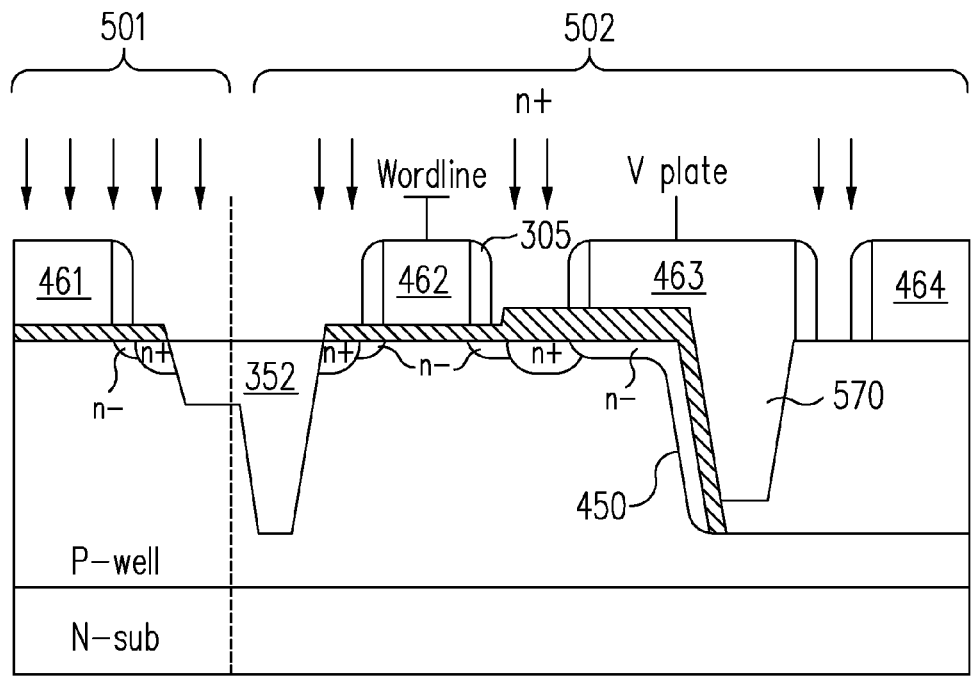
FIG. 10 illustrates a DRAM cell formed by N-channel MOS transistors using a conventional logic process.
Figure 11:
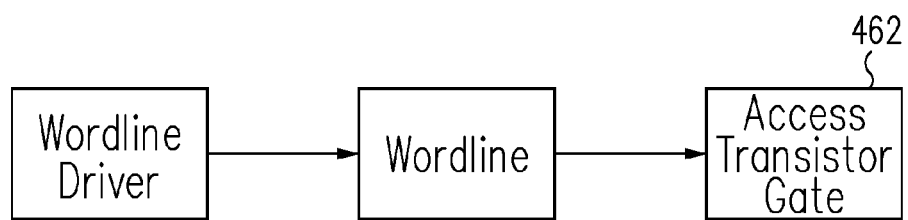
FIG. 11 illustrates a wordline driver that is used to apply voltage to an access transistor of the present invention.

Of course, the access transistor and the capacitor can instead be constructed from NMOS transistors as shown in FIG. 10. In this alternate embodiment, the access transistor has an n-channel with a first n-type source/drain region and a second n-type source/drain region located in a p-well. In this NMOS embodiment, the capacitor is coupled to the second n-type source/drain region of the access transistor, and includes a conductor overlying a portion of the p-well. When the DRAM circuit is not being accessed, a wordline driver is configured to apply a power supply voltage, such as a ground voltage, or a negative voltage, to the gate terminal of the access transistor. To access the NMOS DRAM cell of the present invention, a voltage of VCCB is provided to the gate of the access transistor. VCCB corresponds to the supply voltage Vdd plus a boosted voltage. The boosted voltage varies depending on the geometry of the process, but equals 1.3 multiplied by $V_t$.

In either the PMOS or NMOS embodiment, a precharge voltage VCCH is supplied to the bitline that is coupled to the contact region. If the DRAM cell is constructed of PMOS transistors, then VCCH is preferably between zero and $V_{dd}$. More preferably, VCCH is greater than $\frac{1}{2} V_{dd}$ and less than $V_{dd}$ in the PMOS embodiment. On the other hand, if the DRAM circuit of the present invention is constructed of NMOS transistors, then VCCH should be positive, but less than $\frac{1}{2} V_{dd}$.

The present invention has been described by various examples above. However, the aforementioned examples are illustrative only and are not intended to limit the invention in any way. In the above description, several process flows have been discussed that pertain to planar DRAM cells. Fewer process flows were discussed relative to embedded Q-cells. Nevertheless, whatever options that were described for the planar cell are also applicable to the Q-cell. For example, it is possible to implant the oxidation-enhancing implant 18 into the Q-cell prior to the first oxidation step. An additional implant 13 (shown in FIG. 3C), of opposite conductivity to implant 18 can also be provided in the Q-cell embodiments of this invention. Furthermore, it is also possible to form select gate dielectrics in two oxidation steps in the Q-cell such that select gate dielectrics are made thicker by the second oxidation step. The skilled artisan would readily appreciate that the examples above are capable of various modifications. Thus, the invention is defined by the claims set forth below.

What is claimed is:

1. A dynamic random access memory (DRAM) circuit for storing a logic high state or a logic low state comprising:
a p-type semiconductor region;
an n-well located in the p-type semiconductor region;
a p-channel access transistor having a first p-type source/drain region and a second p-type source/drain region located in the n-well;
a capacitor coupled to the second p-type source/drain region of the access transistor, the capacitor including a conductor overlying a portion of the n-well, wherein a p-type oxidation enhancing implant is located below a gate dielectric of the capacitor; and
a wordline driver connected to a gate terminal of the access transistor, the wordline driver being configured to apply a first voltage to the gate terminal of the access transistor when the DRAM circuit is not being accessed, the first voltage being a positive power supply voltage.

2. The DRAM circuit of claim 1, wherein the wordline driver is further configured to apply a second voltage to the gate terminal of the access transistor when the DRAM circuit is being accessed, the second voltage being less than the threshold supply voltage of the access transistor.

3. The DRAM circuit of claim 2, wherein the second voltage is in the range of −0.50 to −0.80 Volts.

4. The DRAM circuit of claim 1, further comprising:
a contact region located in the n-well and spaced apart from the capacitor; and
a positive voltage source connected to the contact region, the positive voltage source supplying a voltage between $\frac{1}{2} V_{dd}$ and $V_{dd}$.

5. A dynamic random access memory (DRAM) circuit for storing a logic high state or a logic low state, comprising:
an n-type semiconductor region;
a p-well located in the n-type semiconductor region;
an n-channel access transistor having a first n-type source/drain region and a second n-type source/drain region located in the p-well;
a capacitor coupled to the second n-type source/drain region of the access transistor, the capacitor including a conductor overlying a portion of the p-well, and a dielectric, wherein an n-type oxidation enhancing implant is located below said dielectric, and
a wordline driver connected to a gate terminal of the access transistor, the wordline driver being configured to apply a first voltage to the gate terminal of the access transistor when the DRAM circuit is not being accessed, the first voltage being either the ground voltage or a voltage between a negative voltage supply and the ground voltage.

6. The DRAM circuit of claim 5, wherein the wordline driver is further configured to apply a second voltage to the gate terminal of the access transistor when the DRAM circuit is being accessed, the second voltage being Vdd plus a boosted voltage.

7. The DRAM circuit of claim 6, wherein the boosted voltage depends on the threshold voltage ($V_t$) of the access transistor and corresponds to $1.3 \times V_t$.

8. The DRAM circuit of claim 5, further comprising:
a contact region located in the p-well and spaced apart from the capacitor; and
a positive voltage source connected to the contact region, the positive voltage source supplying a voltage between 0 and $\frac{1}{2} V_{dd}$.

9. dynamic random access memory (DRAM) circuit for storing a logic high state or a logic low state comprising:
a p-type semiconductor region;
an n-well located in the p-type semiconductor region;
a p-channel access transistor having a first p-type source/drain region and a second p-type source/drain region located in the n-well;
a capacitor coupled to the second p-type source/drain region of the access transistor, the capacitor including a conductor overlying a portion of the n-well; and
a wordline driver connected to a gate terminal of the access transistor, the wordline driver being configured to apply a first voltage to the gate terminal of the access transistor when the DRAM circuit is not being accessed, the first voltage being less than a positive power supply voltage.

10. The DRAM circuit of claim 9, further comprising:
a contact region in the n-well and spaced apart from the capacitor; and
a positive voltage source connected to the contact region, the positive voltage source supplying a voltage between $\frac{1}{2} V_{dd}$ and $V_{dd}$.

11. The DRAM circuit of claim 9, further comprising a p-type oxidation enhancing implant below a gate dielectric of the capacitor.

* * * * *